US012564065B2

(12) United States Patent
Dhar et al.

(10) Patent No.: US 12,564,065 B2
(45) Date of Patent: Feb. 24, 2026

(54) RADIO FREQUENCY (RF) SWITCH WITH DRAIN/SOURCE CONTACTS

(71) Applicants: STMicroelectronics (Crolles 2) SAS, Crolles (FR); STMicroelectronics International N.V., Geneva (CH)

(72) Inventors: Siddhartha Dhar, Grenoble (FR); Frederic Gianesello, Saint Jeoire Prieuré (FR); Philippe Cathelin, Laval (FR)

(73) Assignees: STMicroelectronics (Crolles 2) SAS, Crolles (FR); STMicroelectronics International N.V., Geneva (CH)

( * ) Notice: Subject to any disclaimer, the term of this patent is extended or adjusted under 35 U.S.C. 154(b) by 407 days.

(21) Appl. No.: 18/193,267

(22) Filed: Mar. 30, 2023

(65) Prior Publication Data

US 2023/0335515 A1 Oct. 19, 2023

Related U.S. Application Data

(60) Provisional application No. 63/331,564, filed on Apr. 15, 2022.

(51) Int. Cl.
*H01L 23/66* (2006.01)
*H01L 23/00* (2006.01)
*H01L 23/522* (2006.01)

(52) U.S. Cl.
CPC .......... *H01L 23/66* (2013.01); *H01L 23/5222* (2013.01); *H01L 23/5226* (2013.01);
(Continued)

(58) Field of Classification Search
CPC . H01L 23/66; H01L 23/5222; H01L 23/5226; H01L 24/05; H01L 24/32;
(Continued)

(56) References Cited

U.S. PATENT DOCUMENTS 7,504,677 B2 3/2009 Glass et al.
8,723,260 B1 5/2014 Carroll et al.
(Continued)

*Primary Examiner* — Tu-Tu V Ho
(74) *Attorney, Agent, or Firm* — Seed IP Law Group LLP

(57) ABSTRACT

The present disclosure is directed to conductive structures that may be utilized in a radio-frequency (RF) switch. The embodiments of the conductive structures of the present disclosure are formed to balance the "on" resistance ($R_{on}$) and the "off" capacitance ($C_{off}$) such that the $R_{on}{\cdot}C_{off}$ value is optimized such that the conductive structures are relatively efficient as compared to conventional conductive structures within conventional RF switches. For example, the conductive structures include various metallization layers that are stacked on each other and spaced apart in a selected manner to balance the $R_{on}$ and the $C_{off}$ as to optimize the $R_{on}{\cdot}C_{off}$ figure of merit as a lower $R_{on}{\cdot}C_{off}$ is preferred.

25 Claims, 11 Drawing Sheets

(52) U.S. Cl.
CPC .............. *H01L 24/05* (2013.01); *H01L 24/32*
(2013.01); *H01L 2223/6616* (2013.01); *H01L*
*2224/32225* (2013.01); *H01L 2924/1306*
(2013.01)

(58) Field of Classification Search
CPC ... H01L 2223/6616; H01L 2224/32225; H01L
2924/1306
USPC ........................................................ 257/774
See application file for complete search history.

(56) References Cited

U.S. PATENT DOCUMENTS

| | | | |
|---|---|---|---|
| 9,847,291 B2 * | 12/2017 | Leong .............. | H01L 23/49827 |
| 9,852,978 B2 | 12/2017 | Roy et al. | |
| 10,177,045 B2 | 1/2019 | Preisler et al. | |
| 10,580,705 B2 | 3/2020 | Blin et al. | |

* cited by examiner

RADIO FREQUENCY (RF) SWITCH WITH DRAIN/SOURCE CONTACTS

BACKGROUND

Technical Field

The present disclosure is directed to conductive structures such as transistor structures that may be utilized in switches.

Description of the Related Art

Generally, conductive structures are present in switches such as electronic switches to switch the electronic switches from an "on" state to an "off" state or vice versa to control an electronic device in which the electronic switches are present. For example, at least one type of electronic switches are radio frequency (RF) switches (e.g., RF transistors). These RF switches are generally configured to route high frequency signals through transmission pathways within electronic devices. These RF switches route signals through these transmission pathways with a relatively high degree of efficiency as compared to other types of switches.

Other types of switches may include mechanical switches that are configured to be mechanically actuated from an "on" state to an "off" state and vice versa by mechanically switching a position of a conductive structure of the mechanical switch from the "on" state (e.g., "on" position) to the "off" state (e.g., "off" position) and vice versa. For example, at least one type of mechanical switch is a single-pole switch.

Unlike the mechanical switches, the RF switches are switched between an "on" state and an "off" state or vice versa by communicating an electrical input signal to respective gates of the RF switches. These RF switches may be or may include transistor structures. For example, the RF switches may be placed in the "on" state by exposing the respective gates of the RF switches to a first voltage, and the RF switches may be placed in the "off" state by exposing the respective gates of the RF switches to a second voltage, which is different from the first voltage.

As electronic devices decrease in size and profile (e.g., overall profile and thickness) and complexity in functionality (e.g., wireless communication), there is an increasing preference for a greater number of ever increasingly more efficient electronic switches (e.g., RF switches) within electronic devices. The efficiency of these RF switches may be determined by various figures of merit. For example, one such figure of merit is a $R_{on} \cdot C_{off}$ value of the RF switch, which is the multiplication product of the Ron ("on" resistance) and Coff ("off" capacitance). A lower $R_{on} \cdot C_{off}$ value is generally preferred as an RF switch with a lower $R_{on} \cdot C_{off}$ value is generally more efficient as compared to an RF switch with a higher $R_{on} \cdot C_{off}$ value.

BRIEF SUMMARY

As discussed above, the increasing preference for ever increasingly more efficient RF switches (e.g., RF transistors) is due to the increasing demand for ever increasingly complex functionality (e.g., wireless communications at higher frequencies and wider bandwidths) in electronic devices. This increase in efficiency may also assist in reducing the size and profile of those electronic devices as well.

The use of RF switches in electronic devices affords the ability to combine higher frequencies and wider bandwidths with integration of multiple RF interfaces and antennas. The use of more efficient RF switches in electronic devices also generally advances the capabilities, functionality, and advancement of the electronic devices in which the RF switches are present.

The present disclosure is directed to structures of RF switches with increased efficiency as compared to conventional RF switches at least with respect to the $R_{on} \cdot C_{off}$ (e.g., the multiplication product of an "on" resistance, $R_{on}$, and an "off" capacitance, $C_{off}$, for example, $R_{on} \cdot C_{off}$) figure of merit of the RF switches of the present disclosure being less than the $R_{on} \cdot C_{off}$ figure of merit of conventional RF switches. The structures of the embodiments of the RF switches of the present disclosure balance the $R_{on}$ and the $C_{off}$ to reduce the $R_{on} \cdot C_{off}$ figure of merit improving the overall efficiency of the RF switches of the present disclosure.

In at least one embodiment of the present disclosure, an RF switch includes a substrate including a surface. A first contact, which may be a drain contact or a source contact, is spaced apart from the surface of the substrate. A second contact, which may be a drain contact or a source contact, is spaced apart from the surface of the substrate and is spaced apart from the first contact. For example, in at least one embodiment, the first contact is a drain contact and the second contact is a source contact. A first conductive structure is between the first and second contacts and the first conductive structure includes a first portion and a second portion. The first portion of the first conductive structure is coupled to the first contact, is coupled to the substrate, and extends toward the second contact. The first portion includes a plurality of discrete segments spaced apart from each other. The second portion is coupled to the second contact, is coupled to the substrate, and extends from the first contact. The second portion includes a plurality of extensions spaced apart from each other, and respective ones of the plurality of extensions are between respective ones of the plurality of discrete segments of the first portion.

In at least some embodiments, the RF switch of the present disclosure further includes a second conductive structure that is spaced apart from the surface of the substrate and overlaps the first portion of the first conductive structure, and the second conductive structure is coupled to the first portion of the first conductive structure.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1A:
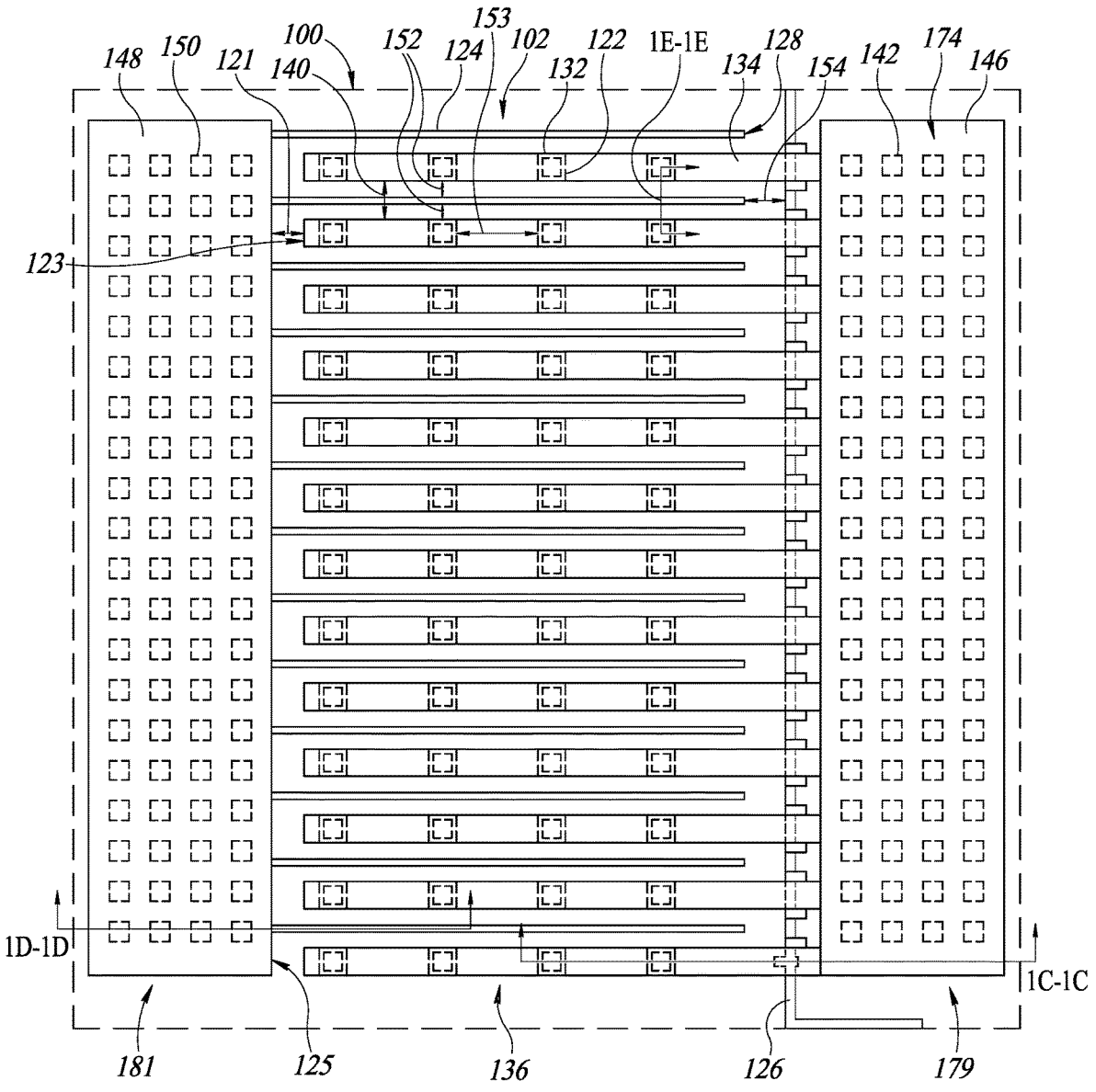
FIG. 1A is a top plan schematic view of an embodiment of a conductive structure of the present disclosure.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, conductive materials, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," "right," or other like locating words are used for only discussion purposes based on the orientation of the components in the discussion of the figures in the present disclosure as follows. These terms are not limiting as to the possible positions explicitly disclosed, implicitly disclosed, or inherently disclosed in the present disclosure.

The term "substantially" is used to clarify that there may be slight differences and variations when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

While embodiments of conductive and semiconductor structures that may be utilized in radio frequency (RF) switches are shown and described within the present disclosure, it will be readily appreciated that embodiments are not limited thereto. In various embodiments, the structures, devices, methods and the like described herein may be embodied in or otherwise utilized in any suitable type or form of semiconductor packages, RF switches, transistors and may be manufactured utilizing any suitable conductive structure, semiconductor structure, RF switch, transistor, and packaging technologies.

Radio frequency (RF) switches (e.g., RF transistors) generally route high frequency signals through transmission pathways. Generally, RF switches route signals through these transmission pathways with a high degree of efficiency. While mechanical switches are switched between an "on" state and an "off" state or vice versa by mechanically changing a position of conductive structures of the mechanical switches, an RF switch is switched between an "on" state and an "off" state or vice versa by communicating an electrical input signal to a gate of the RF switch, which may be a transistor structure or may include a transistor structure. For example, the RF switch may be placed in the "on" state by exposing the gate of the RF switch to a first voltage and the RF switch may be placed in the "off" state by exposing the gate of the RF switch to a second voltage, which is different from the first voltage.

The need for ever increasingly efficient RF switches is due to an increasing demand for ever increasingly complex functionality in electronic devices. The use of RF switches affords the ability to combine higher frequencies and wider bandwidths with integration of multiple RF interfaces and antennas. This allows for improvement with respect to functionality of electronic devices in the field of wireless communications as well as advance the capabilities, functionality, and advancement of the field of wireless communications as a whole.

A figure of merit for measuring the efficiency of an RF switch is $R_{on} \cdot C_{off}$, which is the product of $R_{on}$, "on" resistance, multiplied by $C_{off}$, "off" capacitance (e.g., $R_{on} \cdot C_{off} = R_{on} \cdot C_{off}$). When in the "on" state, the RF switch is represented by a resistor, which has the "on" resistance ($R_{on}$), and, alternatively, when in the "off" state, the RF switch is represented by a capacitor, which has the "off" capacitance ($C_{off}$). In this instance, when the $R_{on} \cdot C_{off}$ is lower, a transistor is more efficient as there is less loss of power for a given area of the transistor or less power loss for a given frequency of operation relative to another transistor having a larger $R_{on} \cdot C_{off}$.

The $R_{on}$ is may be partially dependent on the width of the RF switch (e.g., RF transistor). In other words, as the width of the RF transistor increases, the $R_{on}$ decreases proportionally. As the width of the RF transistor decreases, the $R_{on}$ increases proportionally. In other words, the $R_{on}$ is inversely proportional to the width of the RF transistor such that as the width of the RF transistor increases the $R_{on}$ decreases and vice versa. As the $R_{on}$ decreases, an amount of a signal that readily passes through the RF transistor is increased when the RF transistor is in the "on" state. Oppositely, as the $R_{on}$ increases, the amount of the signal that readily passes through the RF transistor is decreased when the RF transistor is in the "on" state. In other words, a lesser $R_{on}$ is generally preferred over a greater $R_{on}$ as the greater $R_{on}$ reduces and limits the amount of the signal that may readily pass through the RF switch when the RF switch is in the "on" state as compared to the RF switch having the lesser $R_{on}$. Generally, more signal readily passing through the RF transistor when in the "on" state is preferred than less of the signal readily passing through the RF transistor when in the "on" state.

The $C_{off}$ is proportional to the width of the RF transistor. In other words, as the width of the RF transistor increases, the $C_{off}$ increases proportionally. As the width of the RF transistor decreases, the $C_{off}$ decreases proportionally. In other words, the $C_{off}$ is directly proportional to the width of the RF transistor such that as the width of the RF transistor increases the $C_{off}$ increases and vice versa. As the $C_{off}$ decreases, an amount of a signal that readily passes through the RF transistor decreases when the RF transistor is in the "off" state. As the $C_{off}$ increases, the amount of the signal that readily passes through the RF transistor increases when the RF transistor is in the "off" state. Generally, less signal passing through the RF transistor when in the "off" state is preferred than more signal passing through the RF transistor when in the "off" state.

As the $R_{on}$ is inversely proportional to the width of the RF transistor and the $C_{off}$ is directly proportional to the width of the RF transistor, the $R_{on} \cdot C_{off}$ product remains constant depending on various structural features of the RF transistor and is considered a figure of merit for RF switch technology as discussed earlier herein. For example, as the RF switch is composed of multiple transistors, one being in an "on" state and another being in an "off" state, the RF switch's power losses are a combination of power losses due to a combination of the $R_{on}$ (e.g., "on" resistance) and the $C_{off}$ (e.g., "off" capacitance). The efficiency of the transistors may be improved by reducing $R_{on}$ and $C_{off}$ of the transistors to reduce the $R_{on} \cdot C_{off}$ product to reduce the overall power losses of the transistors. In other words, to have best in class RF switches with optimized power loss efficiency, one must align $R_{on}$ losses with $C_{off}$ losses to reduce the $R_{on} \cdot C_{off}$ figure of merit.

In view of the above discussion, the preference for ever increasingly more efficient RF switches (e.g., RF transistors) is due to an increasing demand for every increasingly complex functionality in electronic devices. Also, the preference for ever increasingly more efficient RF switches is due to the preference for utilizing signals of higher frequencies and wider bandwidths within electronic devices.

The present disclosure is directed to conductive structures that may be utilized in RF switches to optimize the efficiency of the RF switches of the present disclosure. The conductive structures of the present disclosure optimize the efficiency of the RF switches of the present disclosure by further reducing the $R_{on} \cdot C_{off}$ figure of merit as compared to conventional RF switches. In other words, the RF switches including the conductive structures of the present disclosure may have a $R_{on} \cdot C_{off}$ figure of merit less than the $R_{on} \cdot C_{off}$ figures of merit of conventional RF switches already utilized within industry. To summarize, the embodiments of the conductive structures, which may be utilized in RF switches, of the present disclosure balance the $R_{on}$ and the $C_{off}$ to reduce the $R_{on} \cdot C_{off}$ figure of merit improving the overall efficiency of the RF switches of the present disclosure as compared to conventional RF switches. In other words, the $R_{on} \cdot C_{off}$ of the RF switches of the present disclosure is less than the $R_{on} \cdot C_{off}$ of the conventional RF switches utilized within the industry.

Figure 1B:
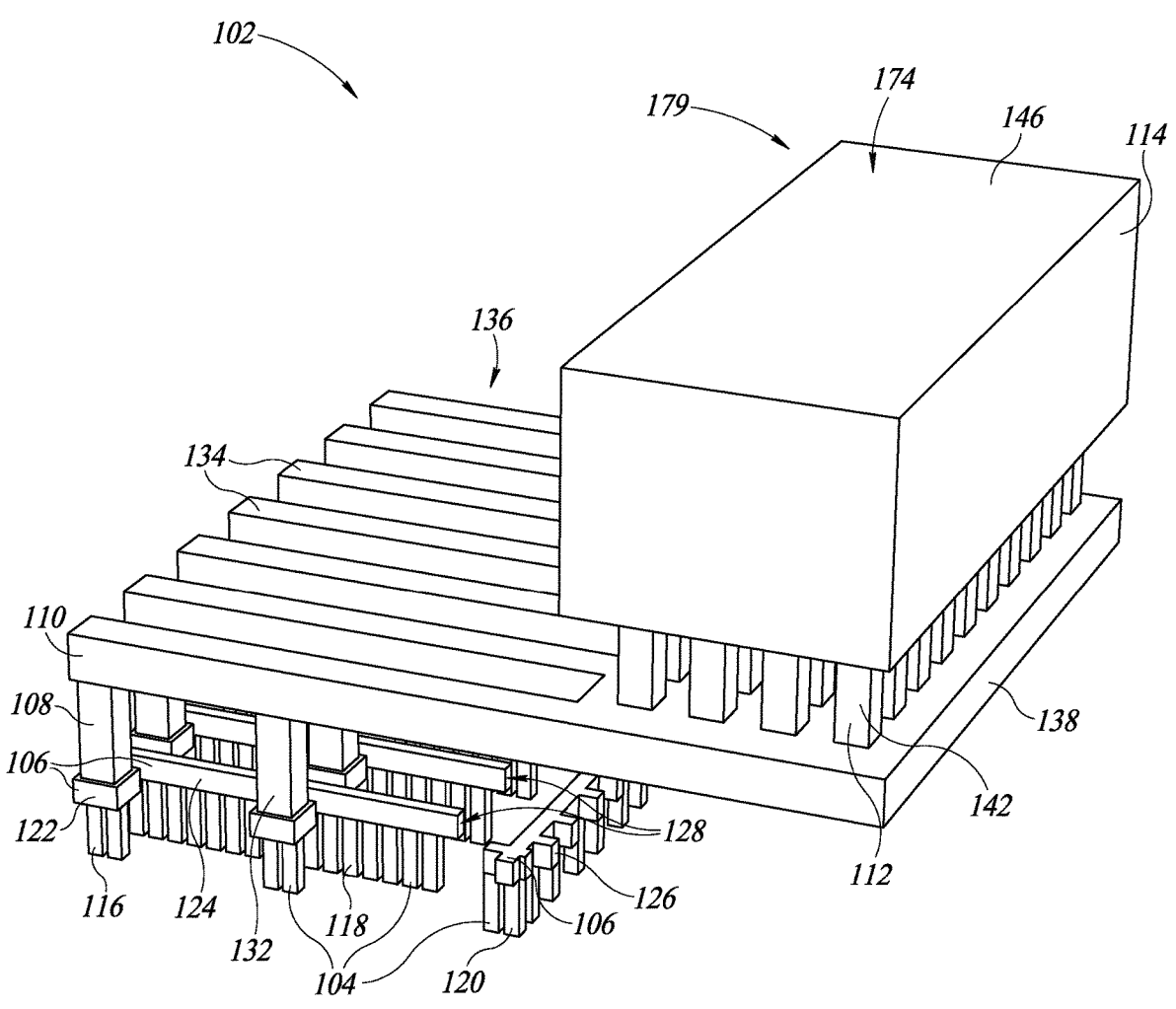
FIG. 1B is a partial perspective view of the embodiment of the conductive structure of the present disclosure as shown in FIG. 1A.
Figure 3:
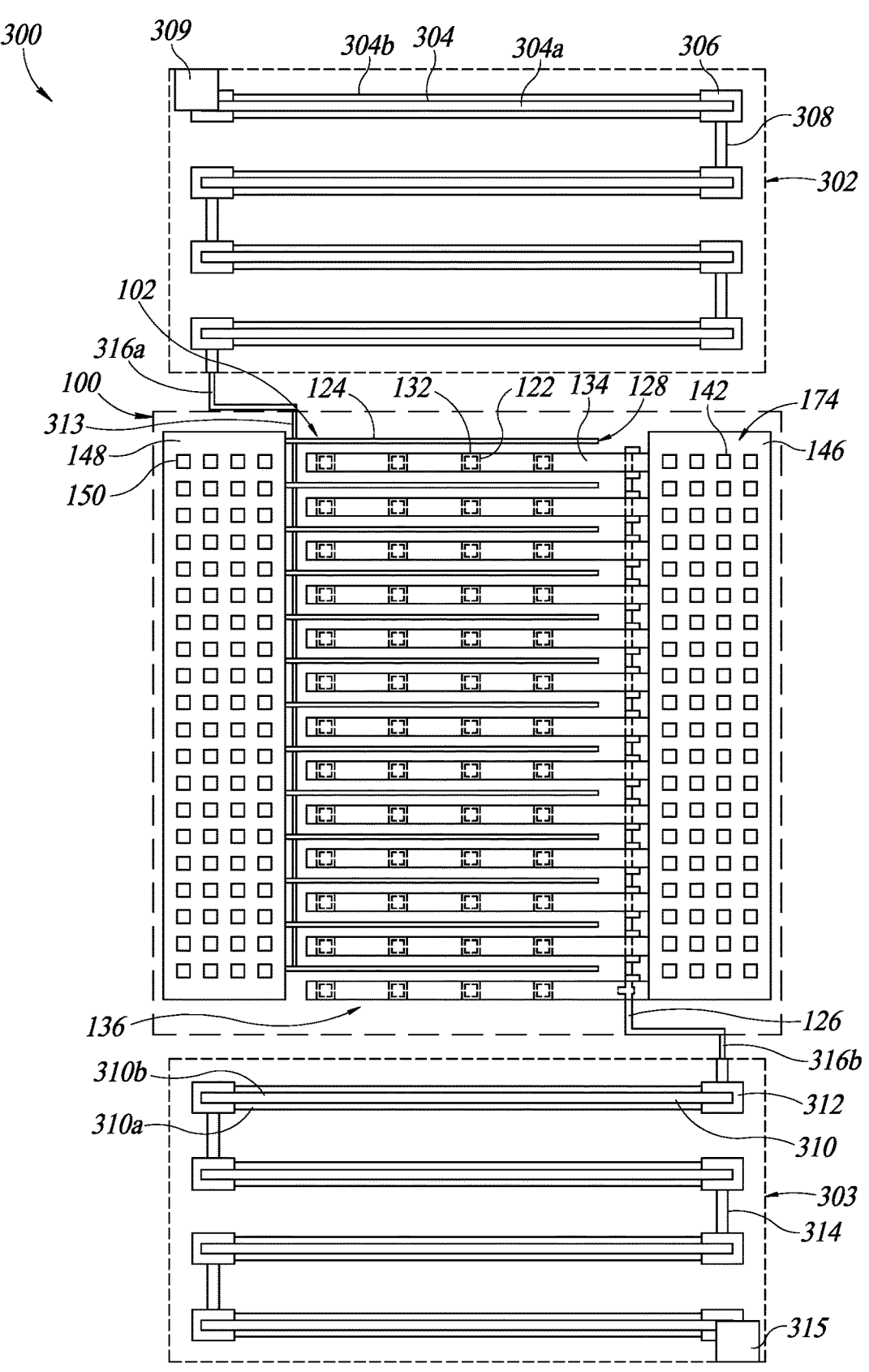
FIG. 3 is directed to a top plan schematic view of an RF switch including the embodiment of the conductive structure as shown in FIG. 1A.

FIG. 1A is directed to a top plan schematic view of a multilayer structure 100 including a conductive structure 102 which may be utilized in an RF switch. For example, the conductive structure 102 is utilized in the RF switch 300 as shown in FIG. 3 of the present disclosure. FIG. 1B is a partial perspective view of a right-hand side of the conductive structure 102 based on the orientation of the conductive structure 102 as shown in FIG. 1A. While the multilayer structure 100 includes a plurality of non-conductive layers 156, 158, 160, 162, 164, 166, which may be more readily seen in FIGS. 1C-1E of the present disclosure, the plurality of non-conductive layers 156, 158, 162, 164, 166 are hidden in FIG. 1B for ease of viewing the conductive structure 102.

As shown in FIG. 1B, the conductive structure 102 includes a first conductive layer 104, a second conductive layer 106, a third conductive layer 108, a fourth conductive layer 110, a fifth conductive layer 112, and a sixth conductive layer 114. These respective conductive layers 104, 106, 108, 110, 112 are stacked on each other to form the conductive structure 102. These respective conductive layers 104, 106, 108, 110, 112, 114 may be referred to as metallization layers (e.g., a first metallization layer 104, a second metallization layer 106, a third metallization layer 108, a fourth metallization layer 110, a fifth metallization layer 112, and a sixth metallization layer 114). The respective conductive layers 104, 106, 108, 110, 112, 114 may be made of a conductive material such as a metal material, an alloy metal material, or some other type of conductive material that readily communicates electrical signals along an electrical pathway or transmission pathway.

The first conductive layer 104 includes one or more first connections 116, one or more second connections 118, and one or more third connections 118. The first, second, and third connections 116, 118, 120 may be referred to as connection vias, electrical vias, or some other reference to the first, second, and third connections 116, 118, 120 being conductive vias. The first, second, and third connections 116, 118, 120 extend to corresponding portions of the second conductive layer 106, which is stacked on the first conductive layer 104. The first, second, and third connections 116, 118, 120 may be electrical connections, electrical contacts, or some other type of electrical structure along which an electrical signal may readily pass through and along.

One or more first portions 122 of the second conductive layer 106 are coupled to respective ones of the one or more first connections 116. Each of the first portions 122 is spaced apart from an adjacent one of the first portions 122. In other words, each of the first portions 122 of the second conductive layer 106 is a discrete and separate portion of the second conductive layer 106. The first portions 122 may be referred to as discrete portions that are separate and distinct from each other.

One or more second portions 124 of the second conductive layer 106 are between groups of one or more first portions 122 of the second conductive layer 106. For example, as shown in FIGS. 1A and 1B, each one of the second portions 124 is between a first group of four of the one or more first portions 122 and a second group of four of the one or more first portions 122. This relationship between the groups of the first portions 122, which are separate and distinct from each other, and the one or more second portions 124 may be more readily seen in FIG. 1A. The second portions 124 may be referred to as continuous portions or extensions that extend continuously unlike the first portions 122, which again are discrete portions that are separate and distinct from each other.

A third portion 126 of the second conductive layer 106 is spaced apart from ends 128 of the one or more second portions 124. The third portion 126 extends in a direction transverse to the second portions 124. The third portion 126 extends continuously similar to the second portions 124 and unlike the first portions 122.

As may readily be seen in FIG. 1B, the first connections 116 extend to corresponding ones of the one or more first portions 122 such that the first connections 116 are coupled to each one of the first portions 122. The second connections 118 extend to corresponding ones of the second portions 124 such that the second connections 118 are coupled to each one of the second portions 124. The third connections 118 extend to the third portion 126 such that the third connections 118 are coupled to the third portion 126.

One or more first vias 132 of the third conductive layer 108 are coupled to corresponding ones of the one or more first portions 122 of the second conductive layer 106. The one or more first vias 132 may be pillars, connections, or some other like reference to the one or more first vias 132 along an electrical pathway. In other words, each one of the first vias 132 is coupled to a corresponding one of the first portions 122. The one or more first vias 132 may be referred to as conductive vias, electrical vias, or some other type of conductive structures coupled to the first portions 122. As may readily be seen in FIG. 1B, the first vias 132 of the third conductive layer 108 are generally larger in volume, size, and shape as compared to the first, second, and third connections 116, 118, 120, respectively, of the first conductive layer 104. In other words, generally, the first vias 132 are larger than the first, second, and third connections 116, 118, 120.

The first vias 132 extend from each one of the plurality of first portions 122 to one or more fingers 134 of a suspended comb-fingered structure 136 of the fourth conductive layer 110. The one or more fingers 134 are coupled to and extend from a platform portion or contact portion 138 of the suspended comb-fingered structure 136. In other words, each one of the fingers 134 is coupled to and extends from the platform portion 138 of the suspended comb-fingered structure 136. The platform portion 138 may be referred to as a platform, a main body, or some other like reference to the platform portion 138 of the suspended comb-fingered structure 136.

Each one of the one or more fingers 134 overlaps a corresponding group of the one or more first portions 122 and a corresponding group of the one or more first vias 132. For example, as shown in FIG. 1A, each one of the fingers 134 overlaps and is aligned with a corresponding group of four of the first portions 122 and a corresponding group of four of the first vias 132. In other words, in this embodiment as shown in FIGS. 1A and 1B of the conductive structure 102, there are four of the first portions 122 for each one of the fingers 134, and there are four of the first vias 132 for each one of the fingers 134. A dimension 140 extends from adjacent ones of the one or more fingers 134 such that each finger 134 is spaced apart from at least one adjacent finger 134 by the dimension 140. The dimension 140 extends in a direction transverse to a direction of which the fingers 134 extend.

Each one of the one or more fingers 134 is offset relative to each one of the one or more second portions 124 of the second conductive layer 106. In other words, in this embodiment as shown in FIG. 1A, the fingers 134 do not overlap and do not crossover the second portions 124 based on the orientation as shown in FIG. 1A. Instead, in this embodiment, each one of the second portions 124 of the second conductive layer 106 is positioned between corresponding adjacent pairs of the fingers 134 of the suspended comb-fingered structure 136. In this embodiment as shown in FIG. 1A, several of the second portions 124 are between adjacent pairs of the fingers 134. For example, each one of the second portions 124 may be spaced equidistantly between the first one and the second one of the adjacent pair of the fingers 134 that are on opposite sides of the corresponding one of the second portions 124.

One or more second vias 142 of the fifth conductive layer 112 extend from the platform portion 138 of the suspended comb-fingered structure 136 of the fourth conductive layer 110. The one or more second vias 132 may be pillars, connections, or some other like reference to the one or more first vias 132 along an electrical pathway. The second vias 142 may be similar to the first vias 132 in that the second vias 142 may be the same or similar in size and shape as the first vias 132. However, in contrast to the first vias 132, the second vias 142 extend from the platform portion 138 to a first drain/source contact 146 of the sixth conductive layer 114. The second vias 142 couple the platform portion 138 of the suspended comb-fingered structure 136 of the fourth conductive layer 110 to the first drain/source contact 146 of the sixth conductive layer 114. The first drain/source contact 146 may be referred to as a contact, a contact pad, or some other like language representative of the first drain/source contact 146.

As shown in FIG. 1A, a second drain/source contact 148 is on the left-hand side of the conductive structure 102 and the multilayer structure 100. The second drain/source contact 148 is opposite to the first drain/source contact 146. The second drain/source contact 148 is on one or more third vias 178, which may be more readily seen in FIG. 1D. The first and second drain/source contacts 146, 148 are either a source contact or a drain contact of the conductive structure 102, which may be a transistor structure of an RF switch of the present disclosure. For example, when the first drain/source contact 146 is a drain contact, the second drain/source contact 148 is a source contact, and, oppositely, when the first drain/source contact 146 is a source contact, the second drain/source contact 148 is a drain contact. In other words, in various embodiments, one of the first and second drain/source contacts 146, 148 is a drain contact and the other one of the first and second drain/source contacts 146, 148 is a source contact. In some embodiments, the first drain/source contact 146 may function as a source contact when exposed to a first voltage and may function as a drain contact when exposed to a second voltage, which is different from the first voltage. In some embodiments, the second drain/source contact may function as a drain contact when exposed to the first voltage and may function as a source contact when exposed to the second voltage.

As shown in FIG. 1A, each one of the second portions 124 of the second conductive layer 106 is spaced apart from each one of the first portions 122 of the second conductive layer 106 by a dimension 152, which extends from one of the second portions 124 to an adjacent one of the first portions 122. The dimension 152 is less than the dimension 140 as shown in FIG. 1A. The dimension 152 may be less than half the dimension 140. The dimension 152 may be selected to optimize the $R_{on}{\cdot}C_{off}$ of the conductive structure 102. For example, adjusting or selecting the dimension 152 may adjust the "off" capacitance ($C_{off}$), the "on" resistance ($R_{on}$), or both. In other words, the dimension 152 may be adapted and selected depending on the situation in which the conductive structure 102 will be utilized to assist in optimizing the $R_{on} \cdot C_{off}$ of the conductive structure 102.

In regions of the multilayer structure 100 having the dimension 152 between adjacent ones of the one or more first portions 122 and the one or more second portions 124 of the second conductive layer 106, one or more extensions 184 (not shown in FIGS. 1A and 1B) are present. The one or more extensions 184 (not shown in FIGS. 1A and 1B) are readily seen in FIG. 1E of the present disclosure. The details of the one or more extensions 184 will be discussed later herein with respect to FIG. 1E.

As shown in FIG. 1A, each of the one or more second portions 124 terminates at a corresponding one of the one or more ends 128 before reaching the third portion 126 of the second conductive layer 106. The one or more ends 128 are spaced apart from the third portion 126 by a dimension 154. A direction of which the dimension 154 extends is transverse to the direction in which the dimensions 140, 152, respectively, extend. For example, the direction in which the dimension 154 extends may be perpendicular or orthogonal to the direction in which the dimensions 140, 152 extend.

A dimension 153 extends between adjacent ones of the first portions 122 of the second conductive layer 106. The dimension 153 extends in a direction transverse to the direction in which the dimensions 140, 152 extend. In this embodiment of the multilayer structure 200, the dimension 153 is greater than the dimensions 140, 152, which may readily be seen in FIG. 1A.

Figure 1C:
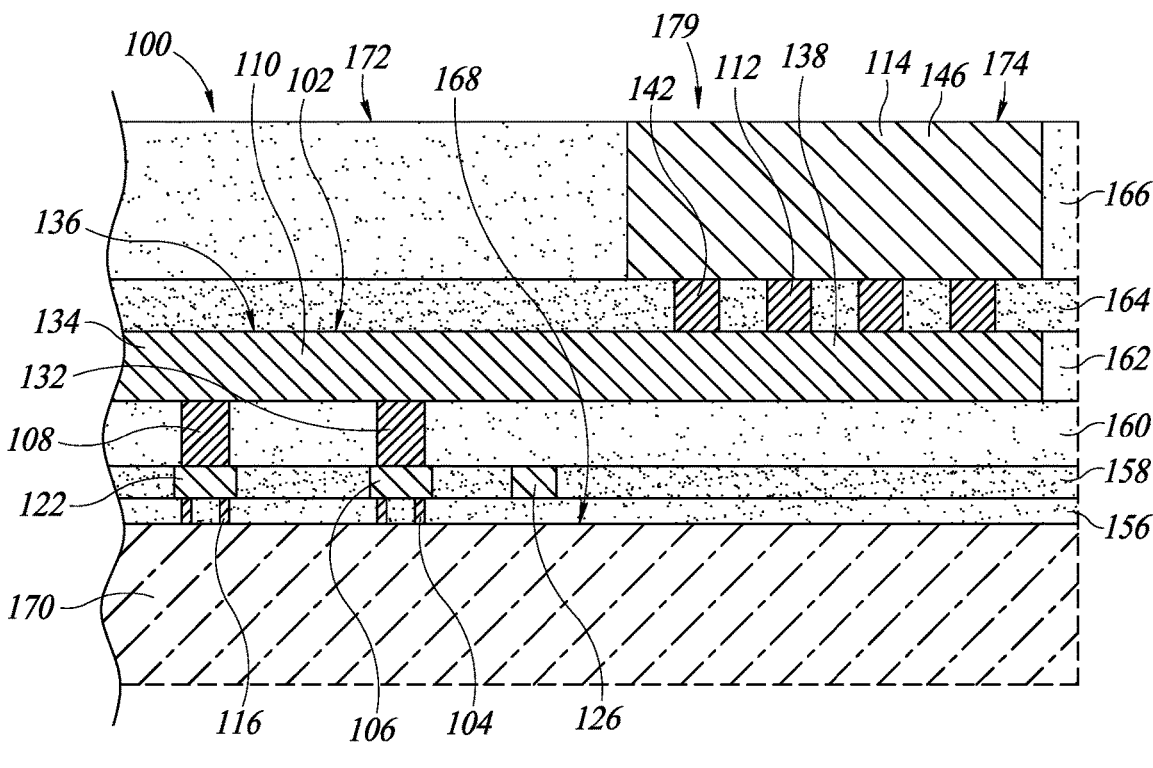
FIG. 1C is a cross-sectional view of the embodiment of the conductive structure as shown in FIG. 1A taken along line 1C-1C as shown in FIG. 1A.

FIG. 1C is a cross-sectional view of the multilayer structure 100 including the conductive structure 102 taken along line 1C-1C as shown in FIG. 1A. As shown in FIG. 1C, the multilayer structure 100 includes the conductive structure 102, which is present within the non-conductive layers 156, 158, 160, 162, 164, 166. The non-conductive layers 156, 158, 160, 162, 164, 166 include a first non-conductive layer 156, a second non-conductive layer 158, a third non-conductive layer 160, a fourth non-conductive layer 162, a fifth non-conductive layer 164, and a sixth non-conductive layer 166. The respective non-conductive layers 156, 158, 160, 162, 164, 166 each may be dielectric layers, insulating layers, passivation layers, repassivation layers, or some other type of non-conductive layers or combination of non-conductive layers that delimit the conductive structure 102 within the multilayer structure 100. The respective conductive layers 104, 106, 108, 110, 112, 114 and the respective non-conductive layers 156, 158, 160, 162, 164, 166 are stacked on each other such that the conductive structure 102, which includes the respective conductive layers 104, 106, 108, 110, 112, 114, is delimited by or defined within the respective non-conductive layers 156, 158, 160, 162, 164, 166.

The respective conductive layers 104, 106, 108, 110, 112, 114 and the respective non-conductive layers 156, 158, 160, 162, 164, 166 are stacked on a surface 168 of a substrate 170. The substrate 170 may be a silicon substrate including one or more doped regions 186 (not shown in FIG. 1C). The conductive layers 104, 106, 108, 110, 112, 114 may be in electrical communication with the one or more doped regions 186 within the substrate 170. The doped regions 186 are more readily seen in FIG. 1E of the present disclosure. For example, the first connections 116 extend from the first portions 122 to the surface 168 of the substrate 170, and the first connections 116 are coupled to the doped regions 186 within the substrate 170. The details of the doped regions 186 within the substrate 170 will be discussed in further detail with respect to FIG. 1E as follows herein.

The sixth non-conductive layer 166 includes a surface 172 that faces away from the substrate 170. The first drain/source contact 146 includes a surface 174 that faces away from the substrate 170 and is exposed from the surface 172 of the sixth non-conductive layer 166. The surface 174 of the first drain/source contact 146 may be substantially coplanar and flush with the surface 172 of the sixth non-conductive layer 166. In some alternative embodiments, the surface 174 of the first drain/source contact 146 may instead be recessed within the sixth non-conductive layer 166 such that the surface 172 of the first drain/source contact 146 is not coplanar or flush with the surface 172 of the sixth non-conductive layer 166.

Figure 1D:
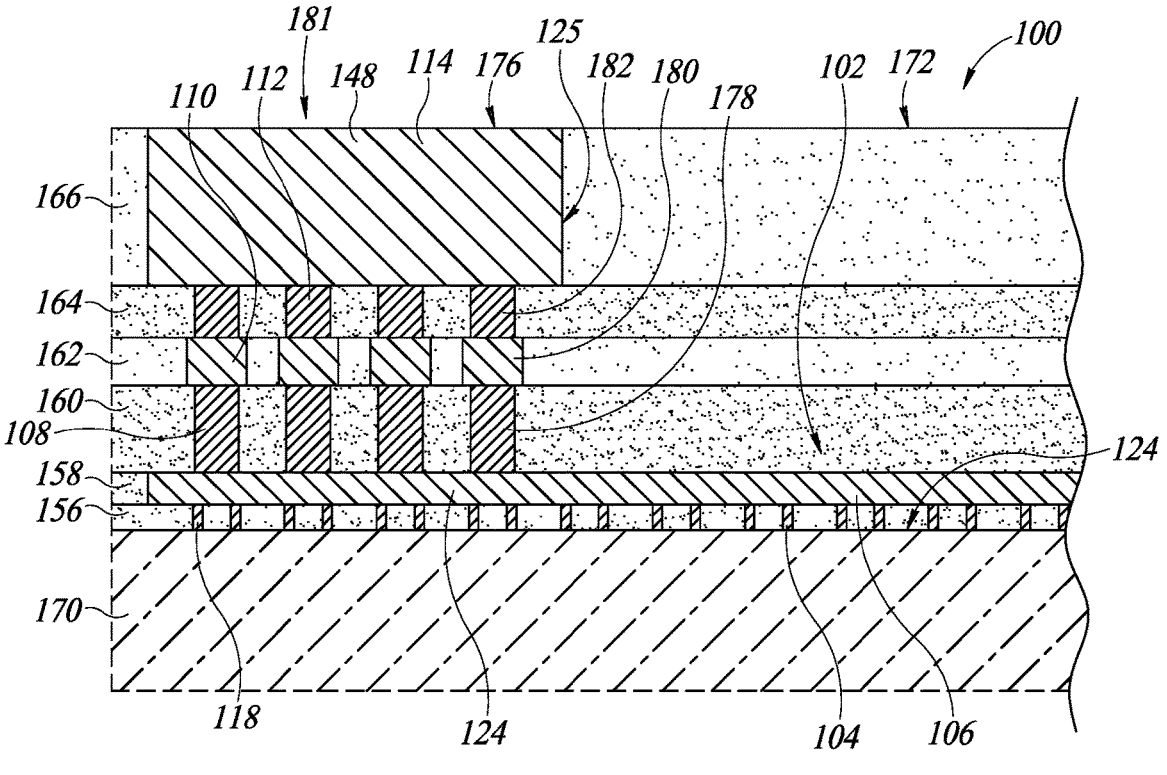
FIG. 1D is a cross-sectional view of the embodiment of the conductive structure as shown in FIG. 1A taken along line 1D-1D as shown in FIG. 1A.

FIG. 1D is a cross-sectional view of the multilayer structure 100 including the conductive structure 102 taken along line 1D-1D as shown in FIG. 1A. As shown in FIG. 1D, the second drain/source contact 148 includes a surface 176 that faces away from the substrate 170 and is exposed from the surface 172 of the sixth non-conductive layer 166. The surface 176 of the second drain/source contact 148 is substantially coplanar and flush with the surface 172 of the sixth non-conductive layer 166. In some alternative embodiments, the surface 176 of the second drain/source contact 148 may instead be recessed within the sixth non-conductive layer 166 such that the surface 176 of the second drain/source contact 148 is not coplanar or flush with the surface 172 of the sixth non-conductive layer 166.

The one or more third vias 178 of the third conductive layer 108 are coupled to the one or more second portions 124 of the second conductive layer 106. The third vias 178 extend from the second portions 124 to one or more conductive portions 180 of the fourth conductive layer 110 within the fourth non-conductive layer 162. One or more fourth vias 182 of the fifth conductive layer 112 are on corresponding ones of the conductive portions 180, and the fourth vias 182 of the fifth conductive layer 112 extend to the second drain/source contact 148 of the sixth conductive layer 114. The fourth vias 182 are coupled to the second drain/source contact 148. The third vias 178 may be the same or similar in size and shape as the first vias 132 as shown in FIG. 1C, and the fourth vias 182 may be the same or similar in size and shape as the second vias 142 as shown in FIG. 1C. The third vias 178, the conductive portions 180, and the fourth vias 182 couple the second drain/source contact 148 to the second portions 124. In some embodiments, all of the conductive portions 180 may be replaced by a single conductive portion, which may be a conductive plate or platform, and the conductive plate may have a structure the same or similar to the platform portion 138 of the suspended comb-fingered structure 136.

In view of the above discussion with respect to FIG. 1C, the first drain/source contact 146 and the second vias 142 may be referred to together as a first contact structure. In view of the above discussion with respect to FIG. 1D, the second drain/source contact 148 and the fourth vias 182 may be referred to as a second contact structure. In view of the above discussion with respect to FIG. 1D, stacked configurations of the third vias 178, the conductive portions 180, and the fourth vias 182 based on the orientation as shown in FIG. 1D may be referred to together as via structures.

Figure 1E:
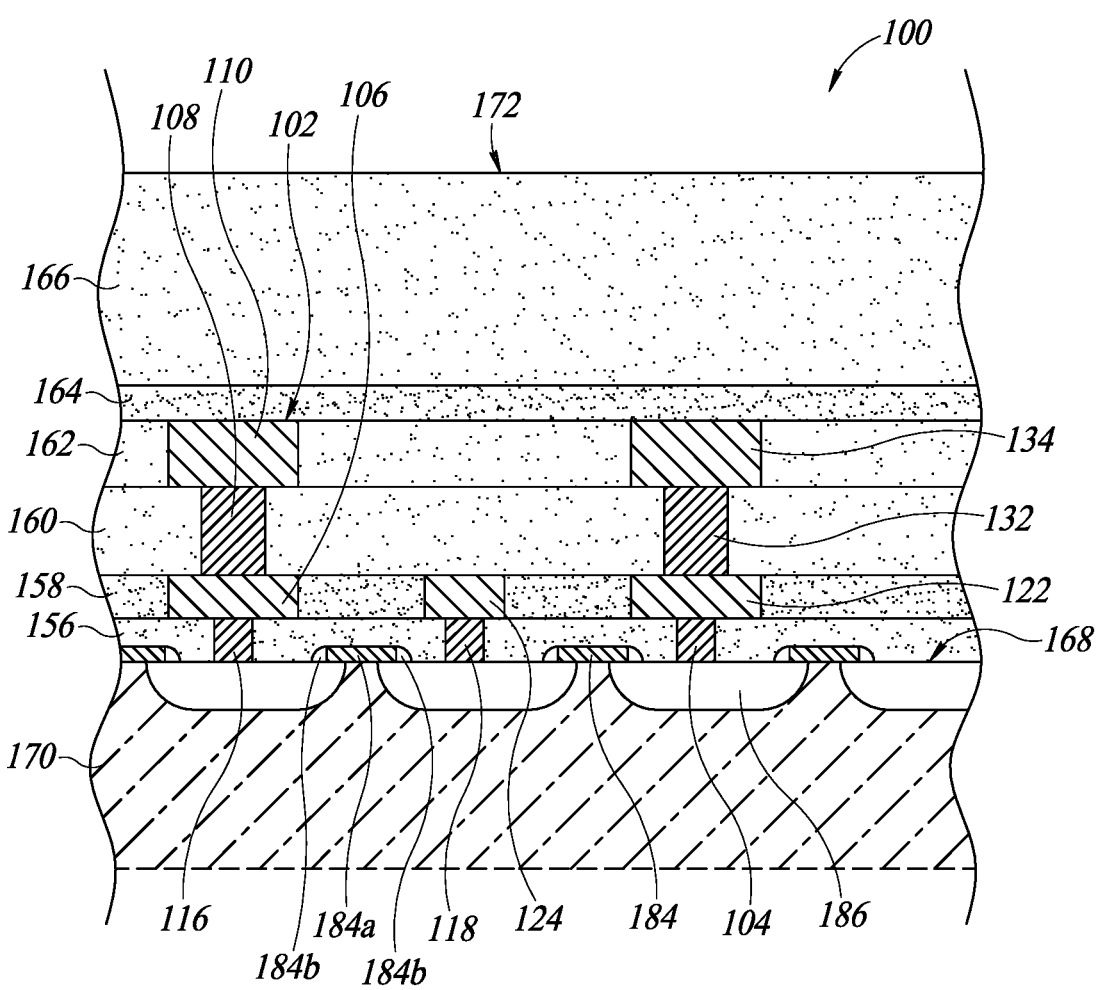
FIG. 1E is a cross-sectional view of the embodiment of the conductive structure as shown in FIG. 1A taken along line 1E-1E as shown in FIG. 1A.

FIG. 1E is a cross-sectional view of the multilayer structure 100 including the conductive structure 102 taken along line 1E-1E as shown in FIG. 1A. As shown in FIG. 1E, the multilayer structure 100 further includes the one or more extensions 184 that are on the surface 168 of the substrate 170. Each of the extensions 184 includes a conductive portion 184*a* and one or more non-conductive portions 184*b* that cover respective ends or sidewalls of the conductive portion 184a. For example, each of the conductive portions 184a may have a corresponding pair of the non-conductive portions 184b, which may readily be seen in FIG. 1E. The non-conductive portions 184b may be a dielectric material, an insulating material, or some other similar or like type of non-conductive material. The conductive portions 184a may be a metal material, a polysilicon material, or some other similar or like type of conductive material. The conductive portions 184a may be a stacked gate structure including a silicon layer stacked on an insulating layer (SiO2), a stacked gate structure including a metal layer stacked on a high-k insulating layer, or may be some other similar or like type of stacked gate structure.

The substrate 170 includes the one or more doped regions 186 that are accessible at the surface 168 of the substrate 170. In other words, the one or more doped regions 186 are exposed from or at the surface 168 of the substrate 170. The doped regions 186 may be p-doped regions, n-doped regions, or some other like type of doped region within the substrate 170 utilized in a transistor structure (e.g., multilayer structure 100) of the present disclosure.

Based on the above discussion with respect to FIGS. 1A-1E, the first connections 116, the first portions 122, the first vias 132, the suspended comb-fingered structure 136, the second vias 142, and the first drain/source contact 146 may be referred to as a first conductive structure 179 together. In some embodiments, this first conductive structure 179 may be referred to as a source structure when the first drain/source contact 146 is a source contact. In some embodiments, this first conductive structure 179 may be referred to as a drain structure when the first drain/source contact 146 is a drain contact. In some embodiments, this first conductive structure 179 may be referred to as a first drain/source structure. For example, in some embodiments, the first conductive structure 179 may act as a drain structure, and, in some alternative embodiments, the first conductive structure 179 may act as a source structure.

Based on the above discussion with respect to FIGS. 1A-1E, the second connections 118, the second portions 124, the third vias 178, the conductive portions 180, the fourth vias 182, and the second drain/source contact 148 may be referred to as a second conductive structure 181 together. In some embodiments, this second conductive may be referred to as a source structure when the second drain/source contact 148 is a source contact. In some embodiments, this second conductive structure 181 may be referred to as a drain structure when the second drain/source contact 148 is a drain contact. In some embodiments, the second conductive structure 181 may be referred to as a second drain/source structure. For example, in some embodiments, the second conductive structure 181 may act as a drain structure, and, in some alternative embodiments, the second conductive structure 181 may act as a source structure.

The first and second conductive structures 179, 181 may be portions of the conductive structure 102 as shown in FIG. 1A. In some embodiments, when the first conductive structure 179 is a drain structure, then the second conductive structure 181 is a source structure. Alternatively, when the first conductive structure 179 is a source structure, then the second conductive structure 181 is a drain structure.

Based on the above discussion with respect to FIGS. 1A-1E, the third connections 118, the third portion 126, and the one or more extensions 184 may be referred to as a third conductive structure that is in electrical communication with the first and second conductive structures 179, 181. The third conductive structure may be referred to as a gate, bias, or gate/bias structure as the third conductive structure is configured as a gate to switch the conductive structure 102 from an "on" state to an "off" state or vice versa. In other words, the first, second, and third conductive structures work together to form a transistor structure (e.g., the multilayer structure 100) at least including a gate, a drain, and a source.

As shown in FIG. 1E, each of the one or more extensions 184 is on a corresponding pair of the one or more doped regions 186. The extensions 184 are coupled to the third connections 118 of the first conductive layer 104 such that the extensions 184 are in electrical communication with the third portion 126 of the second conductive layer 106 through the third connections 118. For example, ones of the third connections 118 extend from the third portion 126 to corresponding ones of the conductive portions 184a of the extensions 184. The extensions 184, which may be referred to as gate lines, may control or dictate whether an electrical signal may pass through the first portions 122 to the second portions 124 or vice versa through the doped regions 186, the one or more first connections 116, and the one or more second connections 118. For example, when a first driving voltage ($V_{DD1}$) is in the extensions 184, an electrical signal is allowed to be communicated and transmitted through the first portions 122 to the second portions 124 or vice versa through the first connections 116, the second connections 118, and the doped regions 186, respectively. Alternatively, when a second driving voltage ($V_{DD2}$), which is different from the first driving voltage ($V_{DD1}$) is in the extensions 184, an electrical signal is blocked from being communicated and transmitted through the first portions 122 to the second portions 124 or vice versa. When the first driving voltage ($V_{DD1}$) is present in the extensions 184, the conductive structure 102 may be in an "on" state or mode. When the second driving voltage ($V_{DD2}$) is present in the extensions 184, the conductive structure 102 may be in an "off" state or mode.

In some embodiments, the first driving voltage ($V_{DD1}$) may be a positive driving voltage and the second driving voltage ($V_{DD2}$) may be a negative driving voltage. In some embodiments, the first driving voltage ($V_{DD1}$) may be a negative driving voltage and the second driving voltage ($V_{DD2}$) may be a positive driving voltage. In some embodiments, one of the first and second driving voltages ($V_{DD1}$, $V_{DD2}$) may be equal to zero. In some embodiments, the first and second driving voltages ($V_{DD1}$, $V_{DD2}$) may be different from each other.

The dimension 152 may be selected to balance the $R_{on}$ and the $C_{off}$ to optimize the $R_{on} \cdot C_{off}$ product. However, the $R_{on} \cdot C_{off}$ product may be further optimized by optimizing a number and placement of the first connections 116 and the first portions 122 associated with respect to the first connections 116. In previous structures, a continuous conductive line was provided instead of the discrete, separated structures of the first portions 122 as shown in FIG. 1B. The larger surface area of the continuous conducive line impacted the $C_{off}$ such that the reduction in surface area of the first portions 122 and the first connections 116 facing the second connections 118 significantly improve performance. The $C_{off}$ may be reduced by reducing the number and placement of the first connections 116 to be the same or similar to those as shown in FIGS. 1A-1E. In addition, the $C_{off}$ may be reduced by utilizing the separate and distinct first portions 122 as shown in FIGS. 1A-1E. The first portions 122 are structured to be large enough such that the first vias 132 may be formed on and coupled to the first portions 122.

A capacitance surface area (e.g., capacitance plate surface area) that is in electrical communication with ones of the doped regions 186 may be reduced by reducing the number of the first connections 116 in embodiments of the transistors of the present disclosure, and by reducing a number of the distinct and separate ones of the first portions 122. While the $C_{off}$ is reduced, the $R_{on}$ may be slightly increased in this embodiment of the conductive structure 102 as shown in FIG. 1E. The $R_{on}$ may be slightly increased as the multiple conductive layers 104, 106, 108, 110, 112, 114 that are stacked on each other may slightly increase a distance that an electrical signal travels between the first drain/source contact 146 and the second drain/source contact 148 as compared to conventional transistor structures. However, the effects of the slight increase in $R_{on}$ is less than the decrease in the $C_{off}$ such that the $R_{on} \cdot C_{off}$ product is optimized and is less than that of conventional transistor structures. In other words, the conductive structure 102 has a reduced $R_{on} \cdot C_{off}$ product as compared to conventional transistor structures such that the $R_{on} \cdot C_{off}$ product of the conductive structure 102 is optimized (e.g., lesser than) as compared to the $R_{on} \cdot C_{off}$ products of conventional transistor structures.

A dimension 121 extends from an end of one of the conductive fingers 134 to a sidewall 125 of the second drain/source contact 148. By reducing the dimension 121, the $R_{on}$ may be decreased as an electrical signal and current travels for a shorter time and shorter distance along the doped regions 186 before traveling into and along the conductive structure 202 by traveling into the first connections 116. Reducing the $R_{on}$ further optimizes the $R_{on} \cdot C_{off}$ product as the $R_{on} \cdot C_{off}$ product is reduced by the reduction in the $R_{on}$.

To summarize, the conductive structure 102 of the present disclosure has a $R_{on} \cdot C_{off}$ product less than conventional conductive structures known within the semiconductor industry by having fewer of the first connections 116 based on the utilization of the first portions 122, which are discrete and separated from each other. This reduced $R_{on} \cdot C_{off}$ allows the conductive structure 102 to function more efficiently as compared to conventional transistor structures known within the semiconductor industry.

Figure 2A:
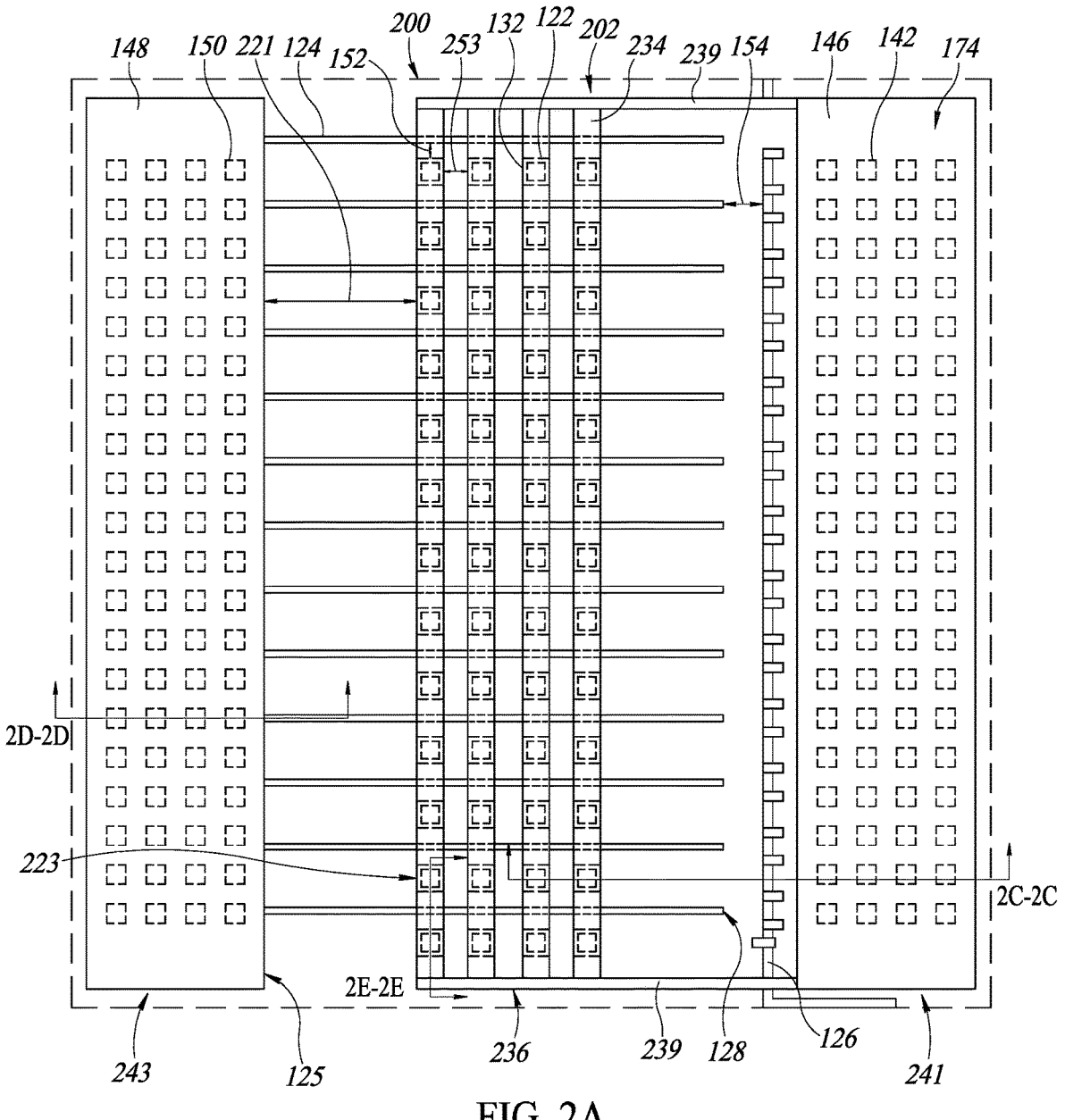
FIG. 2A is a top plan schematic view of an alternative embodiment of a conductive structure of the present disclosure.
Figure 2B:
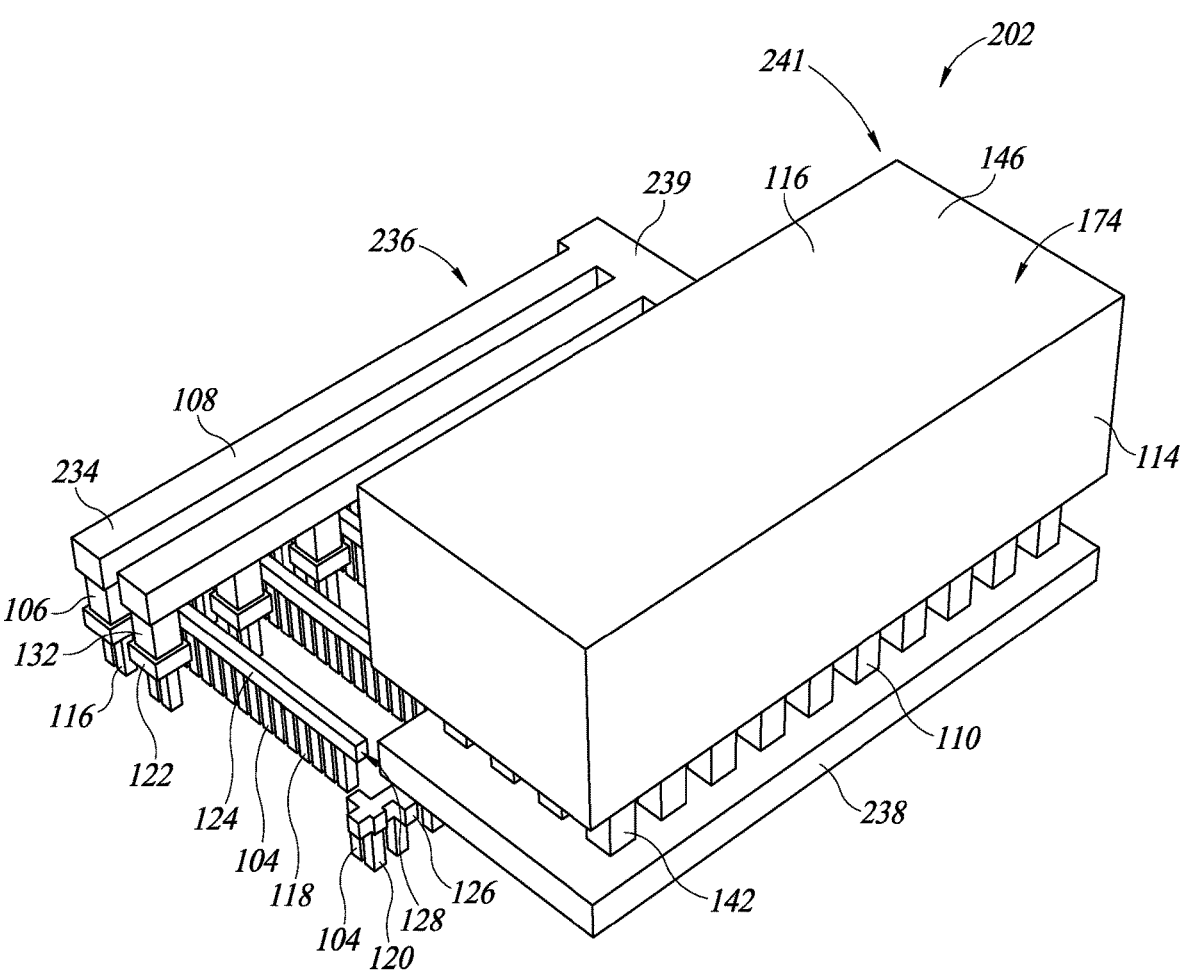
FIG. 2B is a partial perspective view of the alternative embodiment of the conductive structure as shown in FIG. 2A.
Figure 2C:
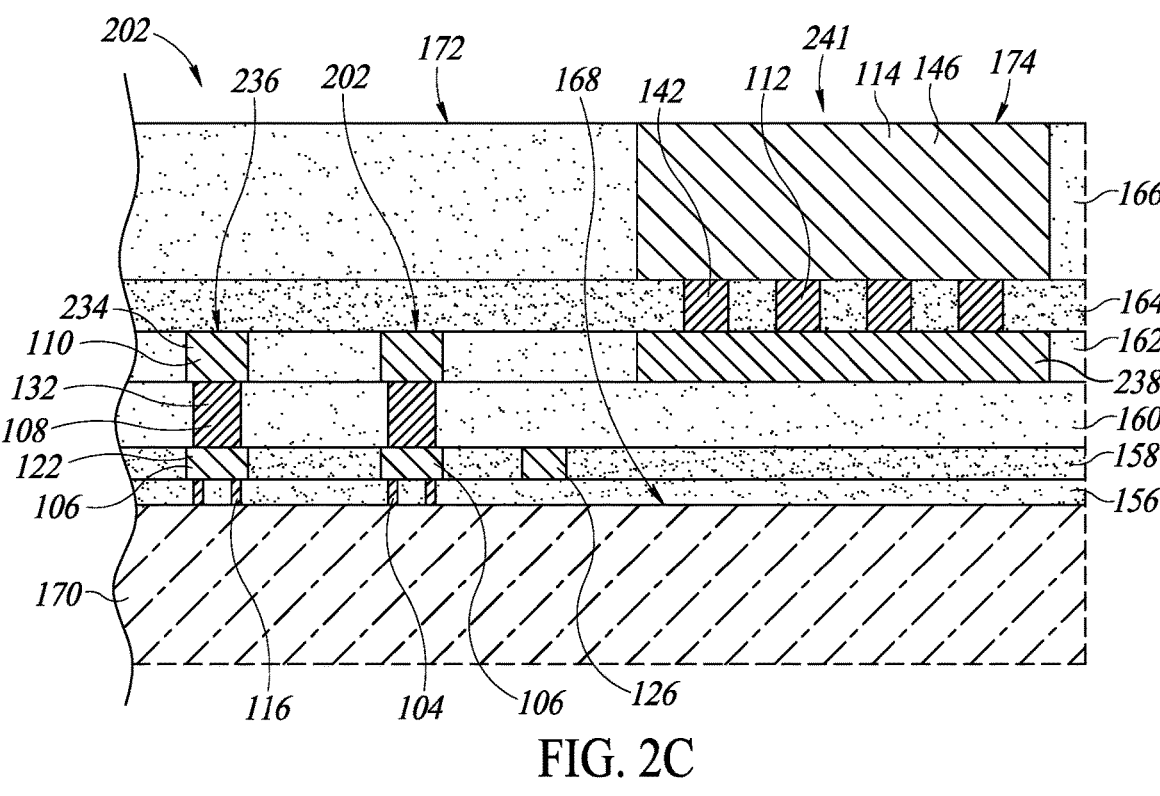
FIG. 2C is a cross-sectional view of the alternative embodiment of the conductive structure as shown in FIG. 2A taken along line 2C-2C as shown in FIG. 2A.
Figure 2D:
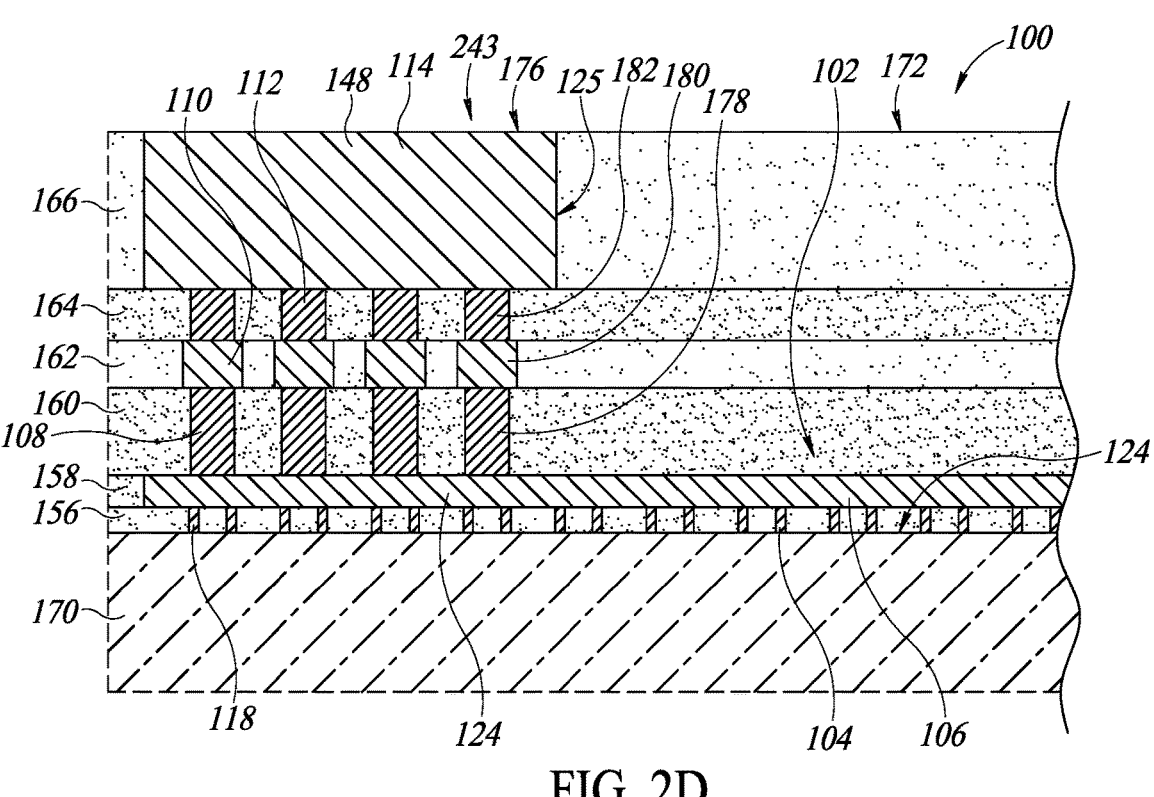
FIG. 2D is a cross-sectional view of the alternative embodiment of the conductive structure as shown in FIG. 2A taken along line 2D-2D as shown in FIG. 2A.
Figure 2E:
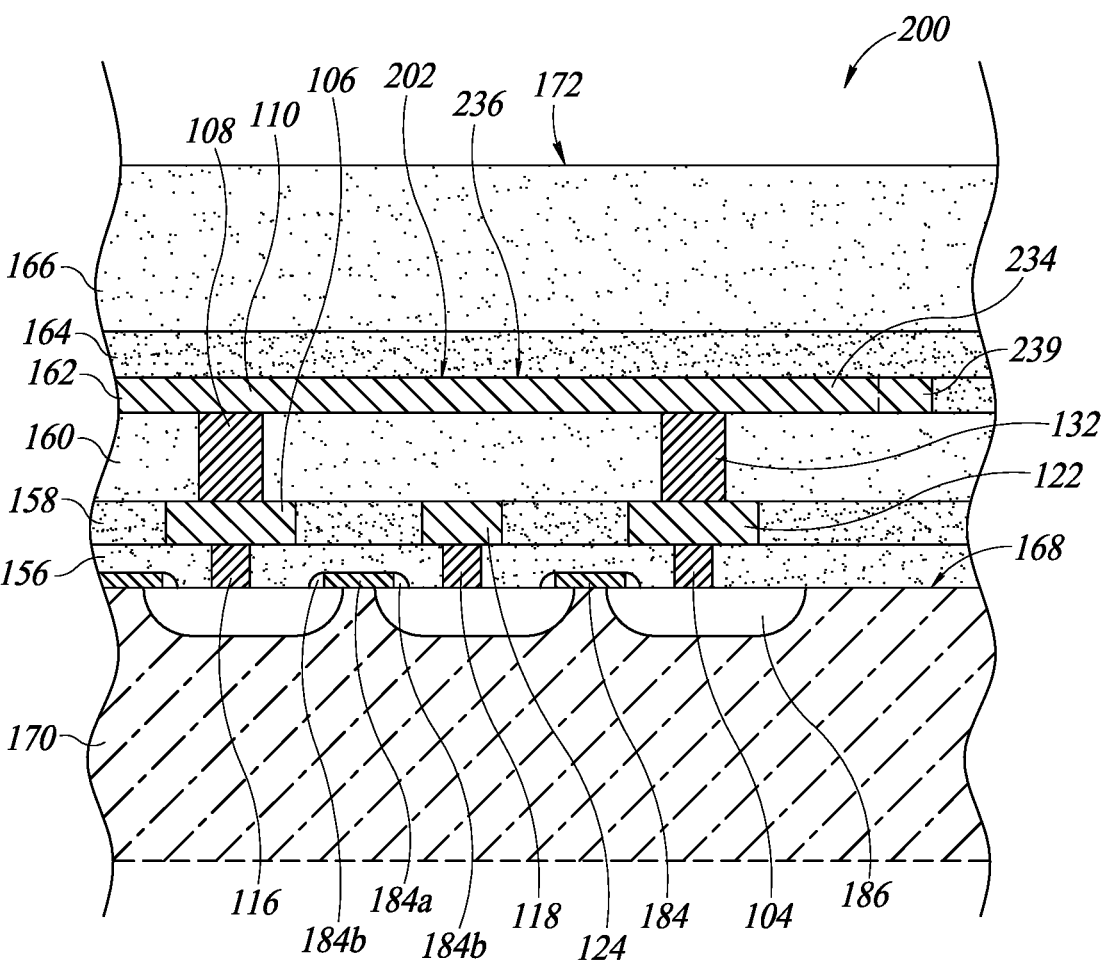
FIG. 2E is a cross-sectional view of the alternative embodiment of the conductive structure as shown in FIG. 2A taken along line 2E-2E as shown in FIG. 2A.

FIG. 2A is a top plan schematic view of an alternative embodiment of a multilayer structure 200 including a conductive structure 202. FIG. 2B is a partial perspective view of the conductive structure 202 with respective non-conductive layers of the multilayer structure 200 such that the conductive structure 202 is more readily visible in FIG. 2B. FIG. 2C is a cross-sectional view taken along line 2C-2C as shown in FIG. 2A. FIG. 2D is a cross-sectional view taken along line 2D-2D as shown in FIG. 2A. FIG. 2E is a cross-sectional view taken along line 2E-2E as shown in FIG. 2A.

While not identical, the conductive structure 202 as shown in FIG. 2A is similar to the conductive structure 102. Accordingly, the same reference numerals will be utilized for features of the conductive structure 202 as shown in FIGS. 2A-2E that are the same or similar to the features of the conductive structure 102 as shown in FIGS. 1A-1E. However, differences between the features in the conductive structure 202 as compared to the conductive structure 102 will be discussed in further detail herein as follows with respect to FIGS. 2A-2E.

As shown in FIG. 2A, the suspended comb-fingered structure 136 as shown in FIG. 1A is replaced by a suspended structure 236 of the fourth conductive layer 110 including one or more conductive extensions 234 that overlap multiple ones of the one or more second portions 124 of the second conductive layer 106. In this embodiment, each of the conductive extensions 234 overlaps all of the second portions 124 of the second conductive layer 106. In this embodiment, there are four of the conductive extensions 234. The conductive extensions 234 are similar to the fingers 134 of the suspended comb-fingered structure 136. However, unlike the fingers 134, the conductive extensions 234 extend vertically based on the orientation as shown in FIG. 2A whereas the fingers 134 extend horizontally based on the orientation as shown in FIG. 1A. The suspended structure 236 further includes one or more connection structures 239 that extend from ends of the conductive extensions 234 to a platform portion 238 of the suspended structure 236. The platform portion 238 is the same or similar to the platform portion 138 of the comb-fingered structure 136 of the conductive structure 102 as shown in FIGS. 1A-1E. The platform portion 238 may be referred to as a platform, a main body, or some other like reference to the platform portion 238 of the suspended structure 236. The connection structures 239 couple the conductive extensions 234 to the platform portion 238. The connection structures 239 are transverse to the conductive extensions 234 such that the connection structures 239 extend horizontally based on the orientation as shown in FIG. 2A as compared to the conductive extensions 234 that extend vertically based on the orientation as shown in FIG. 2A.

The connection structure 239 at the top side of the multilayer structure 200 as shown in FIG. 2A is coupled to first ends of the conductive extensions 234, and the connection structure 239 at the bottom side of the multilayer structure 200 as shown in FIG. 2A is coupled to second ends of the conductive extensions 234. The first ends of the conductive extensions 234 are opposite to the second ends of the conductive extensions 234.

Similar to the conductive structure 102 having fewer of the first connections 116 as compared to the second connections 118, the conductive structure 202 has fewer of the first connections 116 as compared to the second connections 118 as well. Accordingly, the above discussion with respect to the $R_{on} \cdot C_{off}$ of the conductive structure 102 as shown in FIG. 1A applies readily to the $R_{on} \cdot C_{off}$ of the conductive structure 202 as shown in FIGS. 2A-2E. Accordingly, the discussion of the $R_{on} \cdot C_{off}$ of the conductive structure 202 being less than the $R_{on} \cdot C_{off}$ of conventional conductive structures known within the semiconductor industry is not reproduced herein for brevity and simplicity of the present disclosure.

A dimension 221 extends from the sidewall 125 of the second drain/source contact 148 to a sidewall of the left-most conductive extension 234 based on the orientation as shown in FIG. 2A. The dimension 221 as shown in FIG. 2A is larger than the dimension 121 as shown in FIG. 1A.

However, the conductive structure 202 may have a $R_{on} \cdot C_{off}$ that is further optimized as the first portions 122 and the first connections 116 are at a central region of the conductive structure 202 as shown in FIGS. 2A-2E. The $C_{off}$ of the conductive structure 202 as shown in FIG. 2A is further reduces as compared to the $C_{off}$ of the conductive structure 102 as shown in FIG. 1A. The $R_{on}$ may be slightly increased in view of the dimension 221 is larger than the dimension 121 as shown in FIG. 1A. For example, an electrical signal or current may travel a longer distance along the doped regions 186 before traveling into and along the first connections 116 as the dimension 221 as shown in FIG. 2A is greater than the dimension 121 as shown in FIG. 1A. However, even with this slight increase in $R_{on}$ the reduction in $C_{off}$ is significant enough to still reduce the $R_{on} \cdot C_{off}$ product and optimize the $R_{on} \cdot C_{off}$ product relative to a structure of a conventional transistor.

Like the first portions 122 of the second conductive layer 106 as shown in FIG. 1A, the first portions 122 of the second conductive layer 106 are spaced apart from the second portions 124 of the second conductive layer 106 by the dimension 152. However, unlike the first portions 122 of the second conductive layer 106 as shown in FIG. 1A, a dimension 253 extends between adjacent ones of the first portions 122. In this embodiment, the dimension 253 as shown in FIG. 2A is less than the dimension 153 as shown in FIG. 1A. The dimension 253 is closer in value to the dimension 152 as compared to the relationship between the dimension 152 and the dimension 153 as shown in FIG. 1A. For example, in some embodiments of the multilayer structure 200 as shown in FIG. 2A, the dimension 253 may be substantially equal to the dimension 152.

Based on the above discussion with respect to FIGS. 2A-2E, the first connections 116, the first portions 122, the first vias 132, the suspended structure 236, the second vias 142, and the first drain/source contact 146 may be referred to as a first conductive structure 241 together. In some embodiments, this first conductive structure 241 may be referred to as a source structure when the first drain/source contact 146 is a source contact. In some embodiments, this first conductive structure 241 may be referred to as a drain structure when the first drain/source contact 146 is a drain contact. In some embodiments, the first conductive structure 241 may be referred to as a first drain/source conductive structure. For example, in some embodiments, the first conductive structure 241 may act as a drain structure, and, in some alternative embodiments, the first conductive structure 241 may act as a source structure.

Based on the above discussion with respect to FIGS. 2A-2E, the second connections 118, the second portions 124, the third vias 178, the conductive portions 180, the fourth vias 182, and the second drain/source contact 148 may be referred to as a second conductive structure 243 together. In some embodiments, this second conductive may be referred to as a source structure when the second drain/source contact 148 is a source contact. In some embodiment, this second conductive structure 243 may be referred to as a drain structure when the second drain/source contact 148 is a drain contact. In some embodiments, the second conductive structure 243 may be referred to as a second drain/source conductive structure. For example, in some embodiments, the second conductive structure 243 may act as a drain structure, and, in some alternative embodiments, the second conductive structure 243 may act as a source structure.

In some embodiments, when the first conductive structure 241 is a drain structure, then the second conductive structure 243 is a source structure. Alternatively, when the first conductive structure 241 is a source structure, then the second conductive structure 243 is a drain structure.

Based on the above discussion with respect to FIGS. 2A-2E, the third connections 118, the third portion 126, and the one or more extension 184 may be referred to as a third conductive structure that is in electrical communication with the first and second conductive structures 241, 243. The third conductive structure may be referred to as a gate, bias, or gate/bias structure as the third conductive structure is configured as a gate to switch the conductive structure 102 from an "on" state to an "off" state and vice versa. In other words, the first, second, and third conductive structures work together to form a transistor including a gate, a drain, and a source.

FIG. 3 is a top plan schematic view of the multilayer structure 100 as shown in FIGS. 1A-1E within an embodiment of a radio-frequency (RF) switch 300. The RF switch 300 includes the multilayer structure 100 between a gate structure 302 and a body structure 303. The conductive structure 102 of the multilayer structure 100, the gate structure 302, and the body structure 303 are in electrical communication with each other, which will become more readily apparent based on the discussion that follows herein with respect to FIG. 3.

The gate structure 302 includes a plurality of first lines 304, a plurality of vias 306, and a plurality of second lines 308. As shown in FIG. 3, the plurality of first lines 304 are transverse to the plurality of second lines 308, and pluralities of first lines 304 and second lines 308 are coupled together by the plurality of vias 306. In this embodiment, the plurality of first lines 304 may include multiple layers of conductive materials. For example, as shown in FIG. 3, each of the plurality of first lines 304 includes a first conductive line layer 304*a* and a second conductive line layer 304*b* that are stacked on each other. In other words, each of the first conductive line layers 304*a* are stacked on corresponding ones of the second conductive line layers 304*b*. However, in some alternative embodiments, the plurality of first lines 304 may be made of a single layer of conductive material instead of multiple conductive layers stacked on each other. The first conductive line layers 304*a* may be made of a copper material, a gold material, a silver material, an alloy material, a polysilicon material, or some other like or similar type of conductive material. The second conductive line layers 304*b* may be made of a copper material, a gold material, a silver material, an alloy material, a polysilicon material, or some other like or similar type of conductive material.

As shown in FIG. 3, the gate structure 302 includes a contact 309 that is coupled to one of the first lines 304. The contact 309 may be electrically coupled to electrical devices or components external to the RF switch 300. For example, the electrical devices or components may be semiconductor die, electrical connection lines, or some other electrical device or component external to the RF switch 300.

The body structure 303 includes a plurality of third lines 310, a plurality of vias 312, and a plurality of fourth lines 314. As shown in FIG. 3, the plurality of third lines 310 is transverse to the plurality of fourth lines 314, and plurality of third lines 310 and fourth lines 314 are coupled together by the plurality of vias 312. In this embodiment, the plurality of third lines 310 may include multiple layers of conductive materials. For example, as shown in FIG. 3, each of the plurality of third lines 310 includes a third conductive line layer 310*a* and a fourth conductive line layer 310*b* that are stacked on each other. In other words, each of the third conductive line layers 310*a* are stacked on corresponding ones of the fourth conductive line layers 310*b*. However, in some alternative embodiments, the plurality of third connection lines 310 may be made of a single layer of conductive material instead of multiple conductive layers stacked on each other. The third conductive line layers 310*a* may be made of a copper material, a gold material, a silver material, an alloy material, a polysilicon material, or some other like or similar type of conductive material. The fourth conductive line layers 310*b* may be made of a copper material, a gold material, a silver material, an alloy material, a polysilicon material, or some other like or similar type of conductive material.

As shown in FIG. 3, the body structure 303 includes a contact 315 that is coupled to one of the third lines 310. The contact 315 may be electrically coupled to electrical devices or components external to the RF switch 300. For example, the electrical devices or components may be semiconductor die, electrical connection lines, or some other electrical device or component external to the RF switch 300.

The gate structure 302 is coupled to a first connection line 313 that crosses the one or more second portions 124 as shown in FIG. 3. The gate structure 302 is coupled to the first connection line 313 by a second connection line 316*a*, which extends from the gate structure 302 to the first connection line 313. The first connection line 313 may be in electrical communication or electrically coupled to the one or more second portions 124 that the first connection line 313 crosses based on the orientation as shown in FIG. 3. The first connection line 313 is transverse to the one or more second portions 124.

The body structure 303 is coupled to the third portion 126 of the second conductive layer 106 by a third connection line 316*b*, respectively. For example, the third connection line 316*b* couples the body structure 303 to the third portion 126. The third connection line 316*b* may be coupled to an end of the third portion 126 of the second conductive layer 106, which may readily be seen in FIG. 3.

Figure 4:
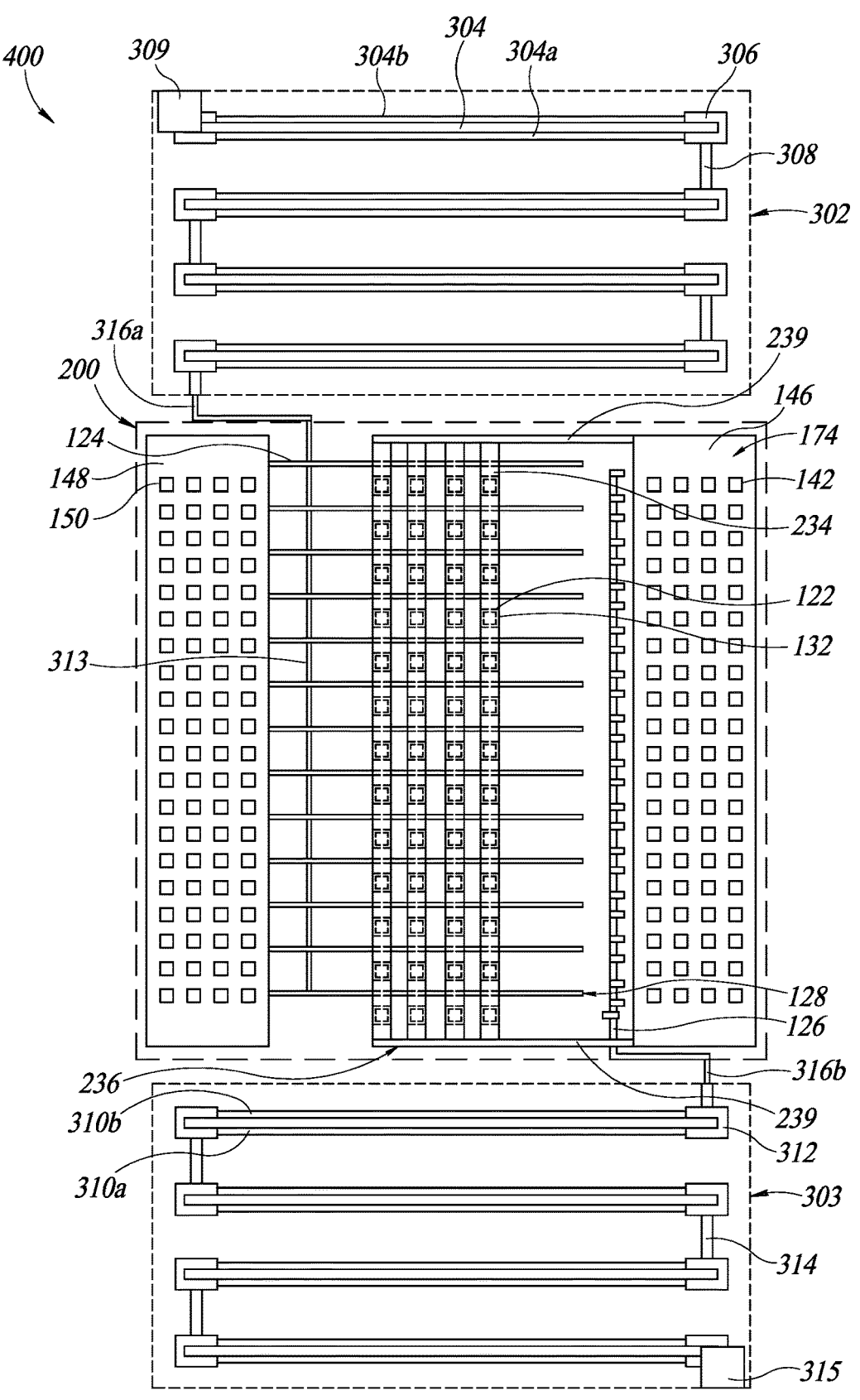
FIG. 4 is directed to a top plan schematic view of an RF switch including the embodiment of the conductive structure as shown in FIG. 2A.

FIG. 4 is a top plan schematic view of the multilayer structure 200 as shown in FIGS. 2A-2E within an embodiment of a radio-frequency (RF) Switch 400. The RF switch 400 includes the multilayer structure 200 between the gate structure 302 and the body structure 303. The conductive structure 202 of the multilayer structure 200, the gate structure 302, and the body 303 are in electrical communication with each other. However, the gate structure 302 and the body structure 303 are in electrical communication with the conductive structure 202 in the same or similar manner as the conductive structure 102 is in electrical communication with the gate structure 302 and the body structure 303 as discussed above with respect to FIG. 3. Accordingly, the electrical communication between the conductive structure 202, the gate structure 302, and the body structure 303 is readily apparent and the discussion of the conductive structure 202, the gate structure 302, and the body structure 303 is not discussed in further detail herein for brevity and simplicity of the present disclosure. In other words, the multilayer structure 100 in FIG. 3 is replaced by the multilayer structure 200 in FIG. 4.

The gate structure 302 in FIGS. 3 and 4 may be configured to switch the RF switches 300, 400 from an "on" state to an "off" state and vice versa. For example, when the gate structure 302 is exposed to a first voltage, the conductive portions 184*a* may act as a conductive channel to allow for electrons to readily pass from first ones of the doped regions 186 (e.g., source regions) to second ones of the doped regions 186 (e.g., drain regions) such that an electrical current readily passes through the conductive features of the RF switches 300, 400, which may be referred to as the "on" state of the RF switches 300, 400. Alternatively, when the gate structure 302 is exposed to a second voltage, the conductive portions 184*a* may act as a conductive block that blocks electrons from readily passing from first ones of the doped regions 186 (e.g., source regions) to second ones of the doped regions 186 (e.g., drain regions) such that an electrical current may not readily pass through the conductive features of the RF switches 300, 400, which may be referred to as an "off" state of the RF switches 300, 400.

The body structure 303 in FIGS. 3 and 4 may be configured to dynamically adjust a threshold voltage ($V_t$) of the RF switches 300, 400. For example, while transistors such as the RF switches 300, 400 may be thought of as having three terminals (e.g., source, gate, and drain), it's increasingly common to have a fourth terminal (e.g., body). In some embodiments, the fourth terminal may be connected to a substrate, or, in some alternative embodiments, the fourth terminal may be connected to some other conductive feature other than the substrate. For example, in some embodiments, a voltage difference between a source voltage (Vs) (e.g., voltage of the source structure of the RF switches 300, 400) and a body voltage (Vb, voltage of the body structure 303 of the RF switches 300, 400) affects the Vt, the body structure 303 may be thought of as a second gate that helps determine how the RF switches 300, 400 are switched between the "on" state and the "off" state. Under normal operation, an unbiased device (e.g., unbiased RF switches 300, 400) has a matching Vs and Vb. Altering the voltage of the device's bulk connection places the RF switch, 300, 400 into either a forward or reverse body bias regime, changing the effective Vt required to turn the RF switches to the "on" state or the "off" state. In other words, the body structure 303 may allow the RF switches 300, 400 to be utilized in ever increasingly complex manners for providing electrical currents or signals to and from various external electronic devices or components.

Figure 5:
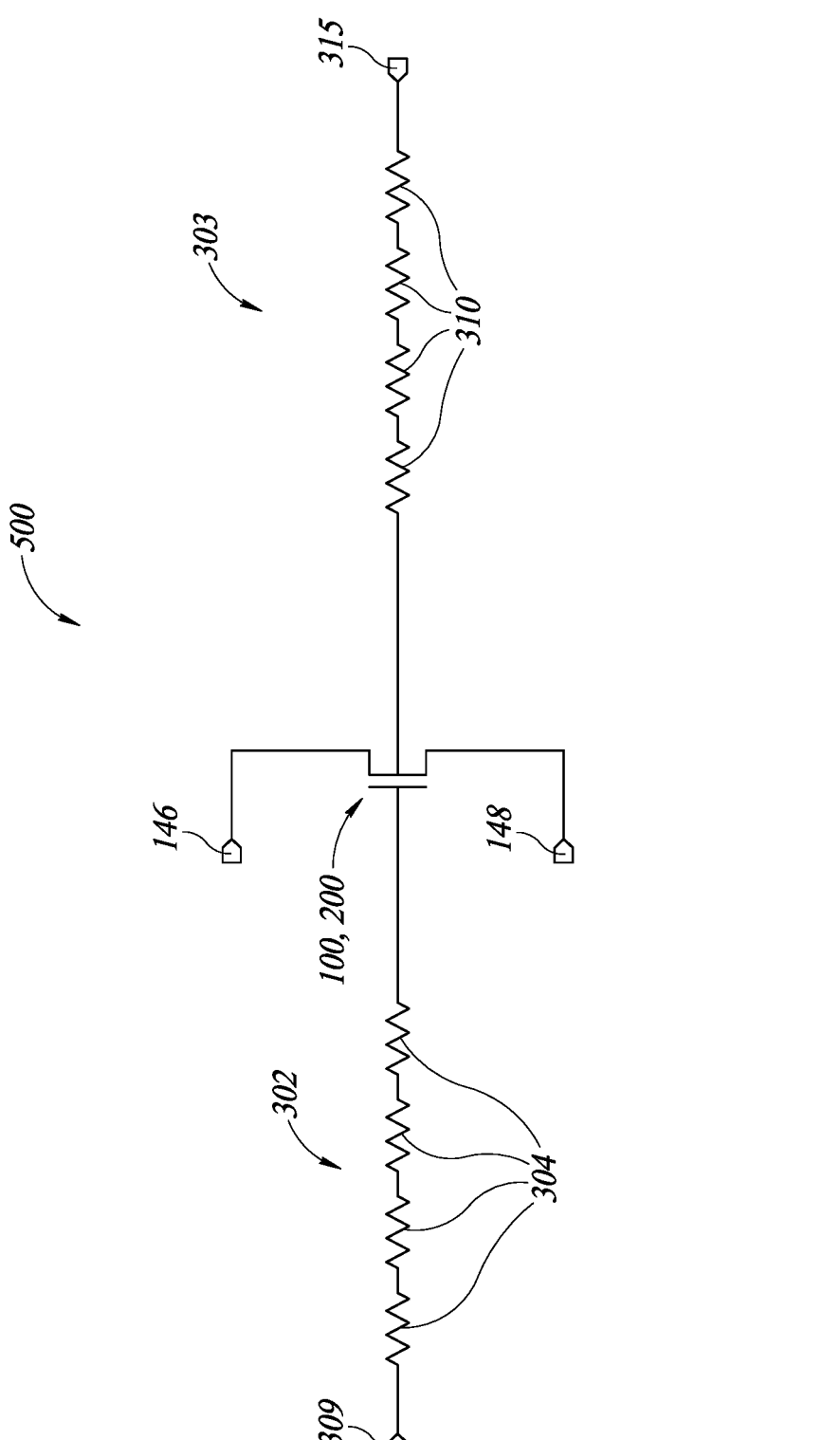
FIG. 5 is directed to a circuit diagram representative of the respective RF switches as shown in FIGS. 3 and 4.

FIG. 5 is a circuit diagram 500 representative of the embodiments of the RF switches 300, 400 as shown in FIGS. 3 and 4 including one of the multilayer structures 100, 200, respectively. Furthermore, it will be readily appreciated from FIGS. 3, 4, and 5 that the RF switches 300, 400 as shown in FIGS. 3, 4, and 5 may be referred to as having four terminals (e.g., source, drain, gate, and body).

As shown in FIG. 5, the plurality of first lines 304 of the gate structure 302 act as resistors, and the plurality of third lines 310 act as resistors of the body structure 303. The resistances of the plurality of first lines 304 and the plurality of third lines 310 may be increased by increasing lengths of the plurality of first lines 304 and the plurality of third lines 310, respectively, and may be decreased by decreasing the lengths of the plurality of first lines 304 and the plurality of third lines 310, respectively. Alternatively, the resistances of the plurality of fourth lines 314 and the plurality of second lines 308 may be increased by increasing lengths of the plurality of fourth lines 314 and the plurality of second lines, respectively, and may be decreased by decreasing the lengths of the plurality of fourth lines 314 and the plurality of second lines 308, respectively. In some embodiments, the overall resistance of the gate structure 302 may be hundreds of Kohm (e.g., kilo-ohms). In some embodiments, the overall resistance of the body structure 303 may be hundreds of Kohm (e.g., kilo-ohms)

The above structures may be manufactured utilizing manufacturing techniques known to the semiconductor industry. For example, these techniques may include deposition techniques, etching techniques, plating techniques, patterning techniques, or some other manufacturing techniques that may be utilized to form the multilayer structures of the multilayer structures 100, 200, respectively, of at least the embodiments of the present disclosure as shown in FIGS. 1A-1E and 2A-2E. These techniques may be utilized as well for forming at least the embodiments of the RF switches as shown in FIGS. 3 and 4 of the present disclosure each including one of the conductive structures 102, 202, respectively.

In view of the above discussion, the $R_{on} \cdot C_{off}$ of the multilayer structures 100, 200, which may be referred to as transistor structures, are reduced as compared to conventional multilayer structures, which may be transistors. This reduced $R_{on} \cdot C_{off}$ of the multilayer structures 100, 200 as compared to the conventional multilayer structure results in the multilayer structures 100, 200 being more efficient and optimized relative to the conventional multilayer structures known within the semiconductor industry.

A device of the present disclosure may be summarized as including: a substrate including a surface; a plurality of conductive portions overlapping the surface of the substrate, each one of the plurality of conductive portions being spaced apart from adjacent ones of the plurality of conductive portions; a plurality of first connections extending from the surface of the substrate to the plurality of conductive portions; a second conductive layer including a plurality of first extensions overlapping the plurality of conductive portions; a plurality of first vias extending from the plurality of conductive portions of the first conductive layer to the plurality of first extensions of the second conductive layer; a plurality of second extensions of a third conductive layer overlapping the surface of the substrate, the plurality of second extensions offset relative to the plurality of first extensions, and at least some of the plurality of second extensions are positioned between respective ones of the plurality of conductive portions; and a plurality of second connections extending from the surface of the substrate to the plurality of second extensions, and at least some of the plurality of second connections are positioned between respective ones of the plurality of first connections.

The plurality of first extensions of the second conductive layer and the plurality of second extensions of the third conductive layer may be parallel with each other.

The plurality of first connections may include a first number of the first connections; and the plurality of second connections may include a second number of the second connections greater than the first number of the first connections.

The device may further include a first contact structure coupled to the second conductive layer; and a second contact structure coupled to the third conductive layer.

The first contact structure may include a first contact overlapping the second conductive layer and a plurality of second vias coupling the first contact to the second conductive layer; and the second contact structure may include a second contact overlapping the third conductive layer and a plurality of via structures coupling the second contact to the third conductive layer.

The plurality of conductive portions may be spaced apart from the plurality of second extensions of the third conductive layer, and the plurality of conductive portions may be in electrical communication with the plurality of second extensions of the third conductive layer.

The plurality of first conductive portions of the first conductive layer may be spaced apart from ones of the plurality of second extensions of the third conductive layer by a first dimension; and the plurality of first conductive portions may be spaced apart from adjacent ones of the plurality of first conductive portions are spaced apart by a second dimension greater than the first dimension.

The first dimension may extend in a first direction parallel to the plurality of first extensions; and the second dimension may extend in a second direction transverse to the first dimension.

The plurality of first extensions may have a first dimension extending in a first direction transverse to a second direction at which the plurality of first extensions extend; and the plurality of second extensions may have a second dimension extending in the first direction, the second dimension being less than the first dimension.

Each one of the plurality of second extensions may be spaced apart from adjacent ones of the plurality of second extensions.

A device of the present disclosure may be summarized as including a substrate including a surface; a plurality of conductive portions overlapping the surface of the substrate, each one of the plurality of conductive portions being spaced apart from adjacent ones of the plurality of conductive portions; a plurality of first conductive connections extending from the surface of the substrate to the plurality of conductive portions; a plurality of first conductive extensions overlapping the plurality of conductive portions; a plurality of conductive vias extending from the plurality of conductive portions to the plurality of first extensions; a plurality of second conductive extensions overlapping the surface of the substrate, the plurality of second conductive extensions are transverse to the plurality of first conductive extensions and overlapped by the plurality of first conductive extensions, and at least some of the plurality of second conductive extensions are positioned between respective ones of the plurality of conductive portions; and a plurality of second conductive connections extending from the surface of the substrate to the plurality of second conductive extensions, and at least some of the plurality of second conductive connections are positioned between respective ones of the plurality of first conductive connections.

The plurality of first conductive extensions may be transverse to the plurality of second conductive extensions.

The plurality of first conductive extensions may be orthogonal to the plurality of second conductive extensions.

The plurality of conductive portions may be spaced apart from the plurality of second conductive extensions, and the plurality of conductive portions may be in electrical communication with the plurality of second conductive extensions.

Each one of the plurality of second conductive extensions may be spaced apart from adjacent ones of the plurality of second conductive extensions.

A device of the present disclosure may be summarized as including: a substrate including a surface; a first conductive structure including: portions of a first conductive layer overlapping the surface of the substrate and spaced apart from the surface of the substrate; a plurality of first connections extending from the surface of the substrate to the portions of the first conductive layer; a plurality of first extensions of a second conductive layer overlapping the portions of the first conductive layer and spaced apart from the portions of the first conductive layer in a first direction orthogonal to the surface of the substrate; a plurality of first vias extending from the portions of the first conductive layer to the plurality of first extensions of the second conductive layer; a first contact coupled to the second conductive layer, the first contact including: a third conductive layer spaced apart from the second conductive layer; and a plurality of second vias extending from the second conductive layer to the third conductive layer; a second conductive structure configured to be in electrical communication with the first conductive structure, the second conductive structure including: a plurality of second extensions of the first conductive layer overlapping the surface of the substrate and spaced apart from the surface of the substrate; a plurality of second connections extending from the surface of the substrate to the plurality of second extensions of the first conductive layer; and a second contact in electrical communication with the plurality of second extension of the first conductive layer; and wherein at least some of the portions of the first conductive layer are between respective ones of the plurality of second extensions of the first conductive layer, and a first number of the plurality of first connections is less than a second number of the plurality of second connections.

The plurality of first extensions of the second conductive layer may be parallel to the plurality of first extensions of the first conductive layer.

The plurality of first extensions of the second conductive layer may be offset from the plurality of second extensions of the first conductive layer.

The plurality of the first extensions of the second conductive layer may be transverse to the plurality of second extensions of the first conductive layer.

The plurality of the first extensions of the second conductive layer may overlap the plurality of the second extensions of the first conductive layer.

A device of the present disclosure may be summarized as including: a substrate including a surface; a first contact spaced apart from the surface of the substrate; a second contact spaced apart from the surface of the substrate and the first contact; a first conductive structure between the first and second contacts, the first conductive structure including: a first portion coupled to the first contact, coupled to the substrate, and extending toward the second contact, the first portion including a plurality of discrete segments spaced apart from each other; and a second portion coupled to the second contact, coupled to the substrate, and extending from the first contact, the second portion including a plurality of extensions spaced apart from each other, and respective ones of the plurality of extensions are between respective ones of the plurality of discrete segments; and a second conductive structure is spaced apart from the surface of the substrate and overlaps the first portion of the first conductive structure, the second conductive structure is coupled to the first portion.

The device may further include a plurality of first connections coupling the first conductive structure to a plurality of doped regions of the substrate at the surface of the substrate, the plurality of first connections including: a first number of the plurality of first connections extending from the first portion to the surface of the substrate, ones of the first number of the plurality of first connections coupling the first portion to respective ones of the plurality of doped regions; and a second number of the plurality of first connections extending from the second portion to the surface of the substrate, ones of the second number of the plurality of first connections coupling the second portion to respective ones of the plurality of doped regions, the second number being greater than the first number.

The device may further include a plurality of first vias extending from respective ones of the plurality of discrete segments of the first portion of the first conductive structure to the second conductive structure, the plurality of first vias coupling the respective ones of the plurality of discrete segments of the first portion to the second conductive structure.

The device may further include a plurality of second vias extending from the second conductive structure to the first contact, the plurality of second vias coupling the second conductive structure to the first contact.

The device may further include a plurality of semiconductor layers that are coupled to respective ones of the plurality of doped regions, ones of the plurality of semiconductor layers are between ones of the first number of the plurality of first connections and ones of the second number of the plurality of first connections.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate including a surface;
a plurality of conductive portions of a first conductive layer overlapping the surface of the substrate, each one of the plurality of conductive portions being spaced apart from adjacent ones of the plurality of conductive portions;
a plurality of first connections extending from the surface of the substrate to the plurality of conductive portions;
a second conductive layer including a plurality of first extensions overlapping the plurality of conductive portions;
a plurality of first vias extending from the plurality of conductive portions to the plurality of first extensions of the second conductive layer;
a plurality of second extensions of a third conductive layer overlapping the surface of the substrate, the plurality of second extensions offset relative to the plurality of first extensions, and at least some of the plurality of second extensions are positioned between respective ones of the plurality of conductive portions; and
a plurality of second connections extending from the surface of the substrate to the plurality of second extensions, and at least some of the plurality of second connections are positioned between respective ones of the plurality of first connections.

2. The device of claim 1, wherein the plurality of first extensions of the second conductive layer and the plurality of second extensions of the third conductive layer are parallel with each other.

3. The device of claim 1, wherein:
the plurality of first connections includes a first number of the first connections; and
the plurality of second connections includes a second number of the second connections greater than the first number of the first connections.

4. The device of claim 1, further comprising:
a first contact structure coupled to the second conductive layer; and
a second contact structure coupled to the third conductive layer.

5. The device of claim 4, wherein:
the first contact structure includes a first contact overlapping the second conductive layer and a plurality of second vias coupling the first contact to the second conductive layer; and
the second contact structure includes a second contact overlapping the third conductive layer and a plurality of via structures coupling the second contact to the third conductive layer.

6. The device of claim 1, wherein the plurality of conductive portions are spaced apart from the plurality of second extensions of the third conductive layer, and the plurality of conductive portions are in electrical communication with the plurality of second extensions of the third conductive layer.

7. The device of claim 1, wherein:

the plurality of conductive portions are spaced apart from ones of the plurality of second extensions of the third conductive layer by a first dimension; and the plurality of conductive portions spaced apart from adjacent ones of the plurality of conductive portions are spaced apart by a second dimension greater than the first dimension.

8. The device of claim 7, wherein:

the first dimension extends in a first direction parallel to the plurality of first extensions; and the second dimension extends in a second direction transverse to the first dimension.

9. The device of claim 1, wherein:

the plurality of first extensions have a first dimension extending in a first direction transverse to a second direction at which the plurality of first extensions extend; and the plurality of second extensions have a second dimension extending in the first direction, the second dimension being less than the first dimension.

10. The device of claim 1, wherein each one of the plurality of second extensions are spaced apart from adjacent ones of the plurality of second extensions.

11. A device, comprising:

a substrate including a surface;

a plurality of conductive portions overlapping the surface of the substrate, each one of the plurality of conductive portions being spaced apart from adjacent ones of the plurality of conductive portions;

a plurality of first conductive connections extending from the surface of the substrate to the plurality of conductive portions;

a plurality of first conductive extensions overlapping the plurality of conductive portions;

a plurality of conductive vias extending from the plurality of conductive portions to the plurality of first extensions;

a plurality of second conductive extensions overlapping the surface of the substrate, the plurality of second conductive extensions are transverse to the plurality of first conductive extensions and overlapped by the plurality of first conductive extensions, and at least some of the plurality of second conductive extensions are positioned between respective ones of the plurality of conductive portions; and a plurality of second conductive connections extending from the surface of the substrate to the plurality of second conductive extensions, and at least some of the plurality of second conductive connections are positioned between respective ones of the plurality of first conductive connections.

12. The device of claim 11, wherein the plurality of first conductive extensions are transverse to the plurality of second conductive extensions.

13. The device of claim 11, wherein the plurality of first conductive extensions are orthogonal to the plurality of second conductive extensions.

14. The device of claim 11, wherein the plurality of conductive portions are spaced apart from the plurality of second conductive extensions, and the plurality of conductive portions are in electrical communication with the plurality of second conductive extensions.

15. The device of claim 11, wherein each one of the plurality of second conductive extensions are spaced apart from adjacent ones of the plurality of second conductive extensions.

16. A device, comprising:

a substrate including a surface;

a first conductive structure including:

portions of a first conductive layer overlapping the surface of the substrate and spaced apart from the surface of the substrate;

a plurality of first connections extending from the surface of the substrate to the portions of the first conductive layer;

a plurality of first extensions of a second conductive layer overlapping the portions of the first conductive layer and spaced apart from the portions of the first conductive layer in a first direction orthogonal to the surface of the substrate;

a plurality of first vias extending from the portions of the first conductive layer to the plurality of first extensions of the second conductive layer;

a first contact coupled to the second conductive layer, the first contact including:

a third conductive layer spaced apart from the second conductive layer; and a plurality of second vias extending from the second conductive layer to the third conductive layer;

a second conductive structure configured to be in electrical communication with the first conductive structure, the second conductive structure including:

a plurality of second extensions of the first conductive layer overlapping the surface of the substrate and spaced apart from the surface of the substrate;

a plurality of second connections extending from the surface of the substrate to the plurality of second extensions of the first conductive layer; and a second contact in electrical communication with the plurality of second extension of the first conductive layer; and wherein at least some of the portions of the first conductive layer are between respective ones of the plurality of second extensions of the first conductive layer, and a first number of the plurality of first connections is less than a second number of the plurality of second connections.

17. The device of claim 16, wherein the plurality of first extensions of the second conductive layer are parallel to the plurality of second extensions of the first conductive layer.

18. The device of claim 17, wherein the plurality of first extensions of the second conductive layer are offset from the plurality of second extensions of the first conductive layer.

19. The device of claim 16, wherein the plurality of the first extensions of the second conductive layer are transverse to the plurality of second extensions of the first conductive layer.

20. The device of claim 19, wherein the plurality of the first extensions of the second conductive layer overlap the plurality of the second extensions of the first conductive layer.

21. A device, comprising:

a substrate including a surface;

a first contact spaced apart from the surface of the substrate;

a second contact spaced apart from the surface of the substrate and the first contact;

a first conductive structure between the first and second contacts, the first conductive structure including:

a first portion coupled to the first contact, coupled to the substrate, and extending toward the second contact, the first portion including a plurality of discrete segments spaced apart from each other; and a second portion coupled to the second contact, coupled to the substrate, and extending from the first contact, the second portion including a plurality of extensions spaced apart from each other, and respective ones of the plurality of extensions are between respective ones of the plurality of discrete segments; and a second conductive structure spaced apart from the surface of the substrate and overlaps the first portion of the first conductive structure, the second conductive structure is coupled to the first portion.

22. The device of claim 21, further comprising:

a plurality of first connections coupling the first conductive structure to a plurality of doped regions of the substrate at the surface of the substrate, the plurality of first connections including:

a first number of the plurality of first connections extending from the first portion to the surface of the substrate, ones of the first number of the plurality of first connections coupling the first portion to respective ones of the plurality of doped regions; and a second number of the plurality of first connections extending from the second portion to the surface of the substrate, ones of the second number of the plurality of first connections coupling the second portion to respective ones of the plurality of doped regions, the second number being greater than the first number.

23. The device of claim 22, further comprising a plurality of first vias extending from respective ones of the plurality of discrete segments of the first portion of the first conductive structure to the second conductive structure, the plurality of first vias coupling the respective ones of the plurality of discrete segments of the first portion to the second conductive structure.

24. The device of claim 23, further comprising a plurality of second vias extending from the second conductive structure to the first contact, the plurality of second vias coupling the second conductive structure to the first contact.

25. The device of claim 22, further comprising a plurality of semiconductor layers that are coupled to respective ones of the plurality of doped regions, ones of the plurality of semiconductor layers are between ones of the first number of the plurality of first connections and ones of the second number of the plurality of first connections.

* * * * *